US012655345B2

(12) United States Patent
Mei et al.

(10) Patent No.: US 12,655,345 B2
(45) Date of Patent: Jun. 16, 2026

(54) QUANTUM DOT LIGHT EMITTING DEVICE AND MANUFACTURING METHOD THEREFOR, AND DISPLAY DEVICE

(71) Applicants: Beijing BOE Technology Development Co., Ltd., Beijing (CN); BOE Technology Group Co., Ltd., Beijing (CN)

(72) Inventors: Wenhai Mei, Beijing (CN); Zhigao Lu, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 869 days.

(21) Appl. No.: 17/787,995

(22) PCT Filed: Aug. 6, 2021

(86) PCT No.: PCT/CN2021/111093
§ 371 (c)(1),
(2) Date: Jun. 22, 2022

(87) PCT Pub. No.: WO2022/062718
PCT Pub. Date: Mar. 31, 2022

(65) Prior Publication Data

US 2023/0337447 A1 Oct. 19, 2023

(30) Foreign Application Priority Data

Sep. 28, 2020 (CN) ......................... 202011037916.6
May 25, 2021 (CN) ......................... 202110573085.2

(51) Int. Cl.
*H10K 50/00* (2023.01)
*C09K 11/06* (2006.01)
(Continued)

(52) U.S. Cl.
CPC ............ *C09K 11/06* (2013.01); *H10K 50/115* (2023.02); *H10K 50/166* (2023.02); *H10K 71/12* (2023.02);
(Continued)

(58) Field of Classification Search
None
See application file for complete search history.

(56) References Cited

U.S. PATENT DOCUMENTS

2008/0118755 A1 5/2008 Whiteford et al.
2019/0006607 A1* 1/2019 Yang .................... C09K 11/565
(Continued)

FOREIGN PATENT DOCUMENTS

CN 103762318 A 4/2014
CN 105161635 A 12/2015
(Continued)

OTHER PUBLICATIONS

Office Action dated Nov. 9, 2021, issued in counterpart CN Application No. 202011037916.6, with English Abstract. (17 pages).
(Continued)

*Primary Examiner* — Nicholas J Tobergte
(74) *Attorney, Agent, or Firm* — WHDA, LLP

(57) ABSTRACT

The present disclosure discloses a quantum dot light emitting device, a preparation method therefor and a display apparatus. In the present disclosure, at least one of one or more layers of light emitting functional layers is disposed to include at least two sub-function layers, the sub-function layers comprise ligands, and surface energies of the ligands corresponding to sub-function layers change in gradient along a transmission direction of carriers in the sub-function layers, so that energy levels of the sub-function layers change in gradient. In this way, the energy levels of the sub-function layers can be matched with the energy levels of
(Continued)

the adjacent light emitting function layers, so that carrier transmission and balance as well as device efficiency can be improved.

20 Claims, 12 Drawing Sheets

(51) Int. Cl.
*H10K 50/115* (2023.01)
*H10K 50/16* (2023.01)
*H10K 71/12* (2023.01)
*H10K 85/10* (2023.01)
*H10K 101/40* (2023.01)

(52) U.S. Cl.
CPC ...... *C09K 2211/10* (2013.01); *H10K 85/1135* (2023.02); *H10K 85/115* (2023.02); *H10K 2101/40* (2023.02)

(56) References Cited

U.S. PATENT DOCUMENTS

| | | | |
|---|---|---|---|
| 2019/0051849 A1 | 2/2019 | Zhou | |
| 2019/0157595 A1 | 5/2019 | Seo et al. | |
| 2019/0198793 A1* | 6/2019 | Guo | H10K 59/80515 |
| 2019/0326539 A1* | 10/2019 | Chung | H10H 20/812 |
| 2021/0043864 A1 | 2/2021 | Li | |
| 2022/0098479 A1 | 3/2022 | Mei et al. | |
| 2022/0416186 A1 | 12/2022 | Takenaka | |

FOREIGN PATENT DOCUMENTS

| | | | |
|---|---|---|---|
| CN | 107342367 A | 11/2017 | |
| CN | 107665949 A | 2/2018 | |
| CN | 109728179 A | 5/2019 | |
| CN | 109817772 A | 5/2019 | |
| CN | 110289360 A | 9/2019 | |
| CN | 112151689 A | 12/2020 | |
| EP | 3544074 A2 * | 9/2019 | C09K 11/025 |

OTHER PUBLICATIONS

Office Action dated Mar. 5, 2025, issued in counterpart CN Application No. 202110573085.2, with English translation. (23 pages).

Non-Final Office Action dated May 29, 2025, issued in U.S. Appl. No. 17/405,963 (24 pages).

* cited by examiner

QUANTUM DOT LIGHT EMITTING DEVICE AND MANUFACTURING METHOD THEREFOR, AND DISPLAY DEVICE

CROSS REFERENCE TO RELEVANT APPLICATIONS

This application claims priority to the Chinese patent application No. 202110573085.2 entitled "A LIGHT EMI TING DEVICE AND MANUFACTURING METHOD THEREFOR, AND DISPLAY DEVICE" filed on May 25, 2021, to the Chinese National Intellectual Property Administration, the entire contents of which are incorporated herein by reference; and meanwhile, claims the priority of the Chinese patent application No. 202011037916.6 entitled "A QUANTUM DOT LIGHT EMITTING DEVICE AND MANUFACTURING METHOD THEREFOR, AND DISPLAY DEVICE" filed on Sep. 28, 2020, to the Chinese National Intellectual Property Administration, the entire contents of which are incorporated herein by reference.

TECHNICAL FIELD

The present application relates to the technical field of display, and more particularly to a quantum dot light emitting device and a manufacturing method therefor, and a display device.

BACKGROUND

Quantum dot Light Emitting diodes (QLED) have the advantages of high luminous intensity, good monochromaticity, high color saturation, good stability and the like, thereby having good application prospects in the field of display. However, a high energy level barrier between a hole transport layer and an electron transport layer and a light-emitting layer commonly used in the QLED at present leads to the high turn-on voltage and low efficiency of devices, which hinders the further application of the QLED.

SUMMARY

Embodiments of the present application provide a quantum dot light emitting device, a preparation method therefor and a display apparatus configured for solving problems of high turn-on voltage and low efficiency of devices.

To achieve the above objects, the embodiments of the present application adopt the following technical solutions.

According to one aspect, a quantum dot light emitting device is provided, which includes an anode, one or more layers of light emitting functional layers and a cathode which are disposed in layer configuration; wherein, at least one of the one or more layers of light emitting functional layers includes at least two sub-function layers, the sub-function layers comprise ligands, and surface energies of the ligands corresponding to sub-function layers change in gradient along a transmission direction of carriers in the sub-function layers, so that energy levels of the sub-function layers change in gradient.

Optionally, at least one of the one or more layers of light emitting functional layers includes three sub-function layers.

Optionally, the ligands include: fluorine-containing group ligands with low surface energies as well as hydrophobic amine ligands and hydrophilic amine ligands with high surface energies;

wherein, when the light emitting function layer is manufactured on a hydrophilic film layer, the surface energies of the hydrophilic amine ligands are greater than that of the hydrophobic amine ligands; and when the light emitting function layer is manufactured on a hydrophobic film layer, the surface energies of the hydrophobic amine ligands are greater than that of the hydrophilic amine ligands.

Optionally, the hydrophilic amine ligands include alcohol amine ligands, and the hydrophobic amine ligands include alkane amine ligands.

Optionally, the light emitting function layer includes an electron transport layer, a quantum dot light emitting layer and a hole transport layer, the electron transport layer is close to the cathode, and the hole transport layer is close to the anode; wherein, at least one of the electron transport layers, the quantum dot light emitting layer or the hole transport layer includes three sub-function layers.

Optionally, when the electron transport layer includes three sub-function layers, the electron transport layer includes a first sub-function layer, a second sub-function layer and a third sub-function layer which are disposed in layer configuration, the first sub-function layer is close to the quantum dot light emitting layer, and the third sub-function layer is close to the cathode; and LUMO energy levels of the first sub-function layer, the second sub-function layer and the third sub-function layer deepen in sequence, and the surface energies of the first sub-function layer, the surface energies of the second sub-function layer and the surface energies of the third sub-function layer decrease in sequence or increase in sequence.

Optionally, when the electron transport layer is manufactured on a hydrophobic film layer, a material of the first sub-function layer is magnesium zinc oxide nanoparticles with hydrophobic amine as ligands, and a molar mass of the magnesium is 0% to 50% that of the magnesium zinc oxide; a material of the second sub-function layer is magnesium zinc oxide nanoparticles with hydrophilic amine as ligands, and a molar mass of the magnesium is 0% to 50% that of the magnesium zinc oxide; and a material of the third sub-function layer is zinc oxide nanoparticles with fluorine-containing groups as ligands, and a content of the magnesium in the first sub-function layer is greater than a content of the magnesium in the second sub-function layer; and when the electron transport layer is manufactured on a hydrophilic film layer, a material of the first sub-function layer is magnesium zinc oxide nanoparticles with fluorine-containing groups as ligands, and a molar mass of the magnesium is 0% to 50% that of the magnesium zinc oxide; a material of the second sub-function layer is magnesium zinc oxide nanoparticles with hydrophobic amine as ligands, and a molar mass of the magnesium is 0% to 50% that of the magnesium zinc oxide; and a material of the third sub-function layer is zinc oxide nanoparticles with hydrophilic amine as ligands, and a content of the magnesium in the first sub-function layer is greater than a content of the magnesium in the second sub-function layer.

Optionally, when the electron transport layer includes three sub-function layers, the electron transport layer includes a first electron transport sub-layer, a second electron transport sub-layer and a third electron transport sub-layer which are disposed in layer configuration along a first direction; the first direction is a direction from the quantum dot light emitting layer to the cathode; and LUMO energy levels of the first electron transport sub-layer, the second electron transport sub-layer and the third electron transport sub-layer deepen in sequence, and the surface energies of the first electron transport sub-layer, the surface energies of the second electron transport sub-layer and the surface energies of the third electron transport sub-layer decrease in sequence.

Optionally, the first electron transport sub-layer includes a first inorganic nanoparticle and a first ligand, the second electron transport sub-layer includes a second inorganic nanoparticle and a second ligand, and the third electron transport sub-layer includes a third inorganic nanoparticle and a third ligand; wherein, refractive indexes of the first inorganic nanoparticle, the second inorganic nanoparticle and the third inorganic nanoparticle decrease in turn, and surface energies of the first ligand, surface energies of the second ligand and surface energies of the third ligand decrease in turn.

Optionally, the quantum dot light emitting layer includes quantum dots and hydrophobic ligands, the first ligand includes an alkyl, the second ligand includes a hydroxyl or a carboxyl, and the third ligand includes a fluorine-containing group.

Optionally, the first ligand includes any one of 1,3-dimethylbutylamine, n-butylamine and iso-propylamine;

the second ligand includes any one of trihydroxymethyl aminomethane, 3-amino-1-propanol and isopropanolamine; and the third ligand includes any one of pentafluoropropionamide, 4-(trifluoromethyl)cyclohexylamine, 3-fluoropropylamine and 4-(trifluoromethylthio)aniline.

Optionally, the quantum dot includes a core-shell structure, and the hydrophobic ligand includes 1-dodecanethiol.

Optionally, the quantum dot light emitting layer includes quantum dots and hydrophilic ligands, the first ligand includes a hydroxyl or carboxyl, the second ligand includes an alkyl, and the third ligand includes a fluorine-containing group.

Optionally, the first ligand includes any one of trihydroxymethyl aminomethane, 3-amino-1-propanol and isopropanolamine;

the second ligand includes any one of 1,3-dimethylbutylamine, n-butylamine and iso-propylamine; and the third ligand includes any one of pentafluoropropionamide, 4-(trifluoromethyl)cyclohexylamine, 3-fluoropropylamine and 4-(trifluoromethylthio)aniline.

Optionally, the quantum dot includes a core-shell structure, and the hydrophilic ligand includes 1-hydroxyhexanethiol.

Optionally, a material of the first inorganic nanoparticle includes any one of titanium dioxide, zinc selenide and zinc sulfide; a material of the second inorganic nanoparticle includes zinc oxide or zirconium oxide; and a material of the third inorganic nanoparticle includes any one of aluminum oxide, magnesium zinc oxide and magnesium oxide.

Optionally, when the quantum dot light emitting layer includes three sub-function layers, the quantum dot light emitting layer includes a fourth sub-function layer, a fifth sub-function layer and a sixth sub-function layer which are disposed in layer configuration, the fourth sub-function layer is close to the hole transport layer, and the sixth sub-function layer is close to the electron transport layer; and HOMO energy levels of the fourth sub-function layer, the fifth sub-function layer and the sixth sub-function layer deepen in sequence, and the surface energies of the fourth sub-function layer, the surface energies of the fifth sub-function layer and the surface energies of the sixth sub-function layer decrease in sequence or increase in sequence.

Optionally, ligands of the fourth sub-function layer have triphenylamine or carbazole ligands, ligands of the fifth sub-function layer have alkane ligands, and ligands of the sixth sub-function layer have pyridine ligands;

when the quantum dot light emitting layer is manufactured on a hydrophobic film layer, the ligands of the fourth sub-function layer further have hydrophobic amine ligands, the ligands of the fifth sub-function layer further have hydrophilic amine ligands, and the ligands of the sixth sub-function layer further have fluorine-containing group ligands; and when the quantum dot light emitting layer is manufactured on a hydrophilic film layer, the ligands of the fourth sub-function layer further have fluorine-containing group ligands, the ligands of the fifth sub-function layer further have hydrophobic amine ligands, and the ligands of the sixth sub-function layer further have hydrophilic amine ligands.

Optionally, when the quantum dot light emitting layer includes three sub-function layers, the quantum dot light emitting layer includes a fourth sub-function layer, a fifth sub-function layer and a sixth sub-function layer which are disposed in layer configuration, the fourth sub-function layer is close to the hole transport layer, and the sixth sub-function layer is close to the electron transport layer, and LUMO energy levels of the fourth sub-function layer, the fifth sub-function layer and the sixth sub-function layer deepen in sequence, and the surface energies of the fourth sub-function layer, the surface energies of the fifth sub-function layer and the surface energies of the sixth sub-function layer decrease in sequence or increase in sequence.

Optionally, when the quantum dot light emitting layer is manufactured on a hydrophobic film layer, the ligands of the fourth sub-function layer have hydrophobic amine ligands, the ligands of the fifth sub-function layer further have hydrophilic amine ligands, and the ligands of the sixth sub-function layer have fluorine-containing group ligands; and when the quantum dot light emitting layer is manufactured on a hydrophilic film layer, the ligands of the fourth sub-function layer further have fluorine-containing group ligands, the ligands of the fifth sub-function layer further have hydrophobic amine ligands, and the ligands of the sixth sub-function layer have hydrophilic amine ligands.

Optionally, when the hole transport layer includes three sub-function layers, the hole transport layer includes a seventh sub-function layer, an eighth sub-function layer and a ninth sub-function layer which are disposed in layer configuration, the seventh sub-function layer is close to the anode, and the ninth sub-function layer is close to the quantum dot light emitting layer; and HOMO energy levels of the seventh sub-function layer, the eighth sub-function layer and the ninth sub-function layer deepen in sequence, and the surface energies of the seventh sub-function layer, the surface energies of the eighth sub-function layer and the surface energies of the ninth sub-function layer decrease in sequence or increase in sequence.

Optionally, when the hole transport layer is manufactured on a hydrophilic film layer, a material of the seventh sub-function layer is nickel oxide nanoparticles with hydrophilic amine as ligands; a material of the eighth sub-function layer is nickel cesium oxide nanoparticles with hydrophobic amine as ligands, and a molar mass of the cesium is 0% to 50% that of the nickel cesium oxide; and a material of the ninth sub-function layer is nickel cesium oxide nanoparticles with fluorine-containing groups as ligands, a molar mass of the cesium is 0% to 50% that of the nickel cesium oxide, and a content of the cesium in the ninth sub-function layer is greater than a content of the cesium in the eighth sub-function layer; and when the hole transport layer is manufactured on a hydrophobic film layer, a material of the seventh sub-function layer is nickel oxide nanoparticles with fluorine-containing groups as ligands; a material of the eighth sub-function layer is nickel cesium oxide nanoparticles with hydrophilic amine as ligands, and a molar mass of the cesium is 0% to 50% that of the nickel cesium oxide; and a material of the ninth sub-function layer is nickel cesium oxide nanoparticles with hydrophobic amine as ligands, a molar mass of the cesium is 0% to 50% that of the nickel cesium oxide, and a content of the cesium in the ninth sub-function layer is greater than a content of the cesium in the eighth sub-function layer.

An embodiment of the present application provides a display apparatus, including the quantum dot light emitting device above.

According to yet another aspect, a preparation method of the quantum dot light emitting device above is provided, including:

forming an anode, one or more layers of light emitting functional layers and a cathode which are disposed in layer configuration; wherein, at least one of the one or more layers of light emitting functional layers is formed through a one-time spin-coating process and includes at least two sub-function layers; wherein, the sub-function layers comprise ligands, and surface energies of the ligands corresponding to sub-function layers change in gradient along a transmission direction of carriers in the sub-function layers, so that energy levels of the sub-function layers change in gradient.

Optionally, the step of forming the light emitting function layer includes:

preparing three function layer materials with surface energies and energy levels of the ligands changing in gradient;

mixing the three function layer materials to form a mixed solution; and spin-coating the mixed solution by adopting a spin-coating method to form the light emitting function layers.

Optionally, when the mixed solution is spin-coated on a hydrophilic film layer, surface energies of hydrophilic amine ligands are greater than that of hydrophobic amine ligands; and when the mixed solution is spin-coated on a hydrophobic film layer, the surface energies of the hydrophobic amine ligands are greater than that of the hydrophilic amine ligands.

The above description is merely an overview of the technical solutions of the present application, which may be implemented in accordance with the contents of the description in order to make the technical means of the present application more clearly understood. In order to make the above and other objects, features, and advantages of the present application more apparent and comprehensible, preferred embodiments of the present application are set forth below.

BRIEF DESCRIPTION OF THE DRAWINGS

In order to illustrate the embodiments of the present application or the technical solutions in the related art more clearly, the following will briefly introduce the accompanying drawings needed to be used in the description of the embodiments or related art; obviously, the drawings in the description below are some embodiments of the present application, and for those of ordinary skills in the art, other drawings may also be obtained from these drawings without creative efforts.

DETAILED DESCRIPTION OF THE EMBODIMENTS

Figure 1:
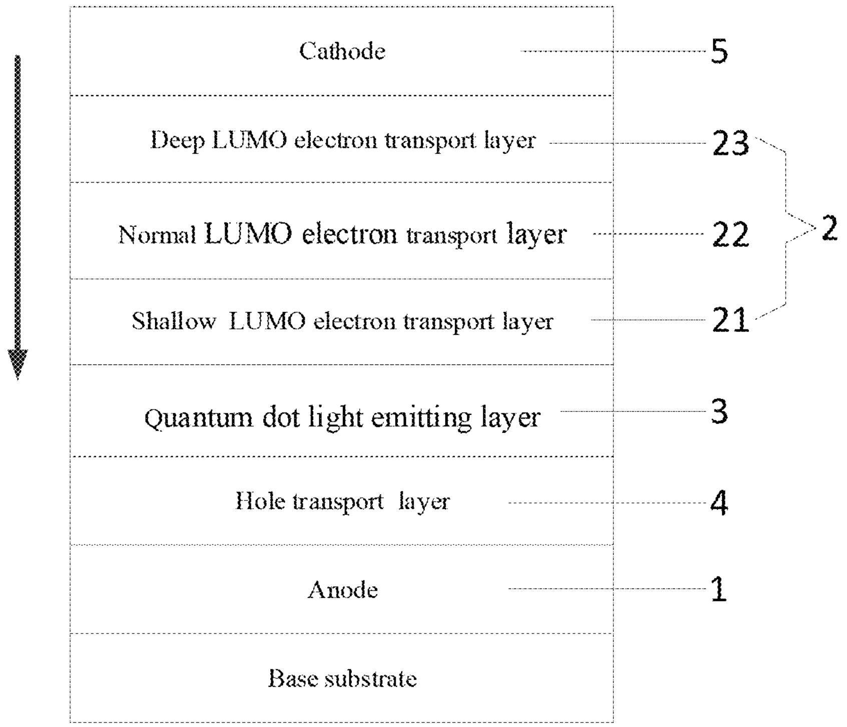
FIG. 1 to FIG. 8 are schematic structural diagrams of a quantum dot light emitting device provided by an embodiment of the present application.

Hereinafter, the technical solutions in the embodiments of the present application are illustrated clearly and completely with the accompanying drawings in the embodiments of the present application. Apparently, the described embodiments are merely some but not all of the embodiments of the present application. Based on the embodiments in the present application, all other embodiments obtained by those of ordinary skills in the art without going through any creative work shall fall within the scope of protection of the present application.

In the embodiments of the present application, words such as "first", "second" and "third" are used to distinguish the same items or similar items with basically the same functions and effects, which are only used to clearly describe the technical solutions of the embodiments of the present application, and are not to be construed as indicating or implying any relative importance or a number of indicated technical features.

In the embodiments of the present application, "multiple layers" means two or more layers, and "at least one layer" means one or more layers, unless otherwise specified.

In the embodiments of the present application, the orientations or positional relationships indicated by the terms "up" and "down" are based on the orientations or positional relationships shown in the drawings, only for convenience and simplification of the description of the present application, and do not indicate or imply that the referred devices or elements must have a specific orientation, be constructed and operated in a specific orientation, so the indicated orientation or positional relationship cannot be understood as limitations of the present application.

The shape and size of members in the accompanying drawings do not reflect true scales, and are only intended to schematically illustrate the content of the present application.

The detailed description of a quantum dot light emitting device, a preparation method therefor and a display apparatus provided by embodiments of the present application is illustrated in detail below in conjunction with the accompanying drawings.

Figure 2:
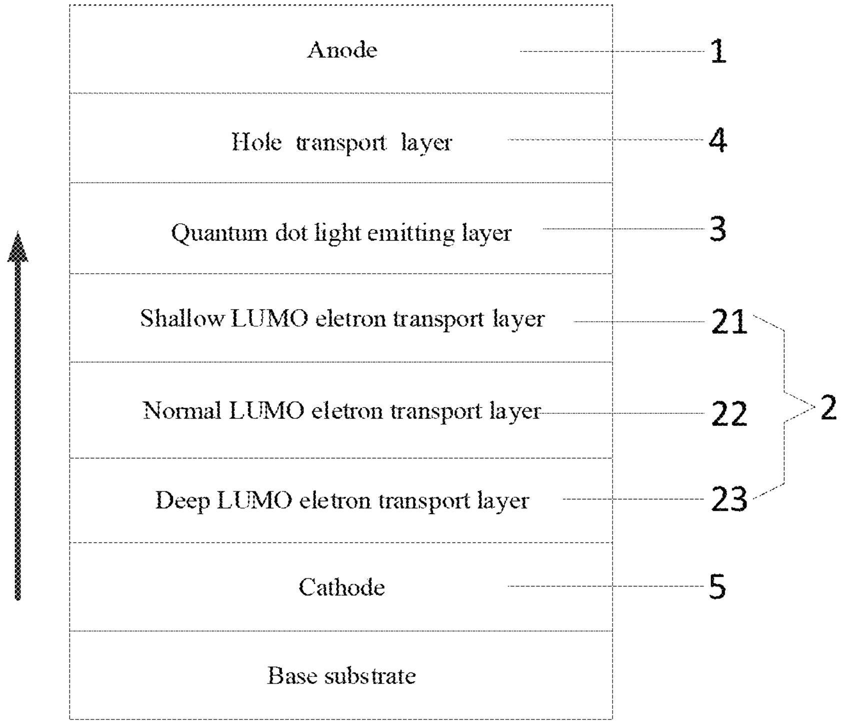
Figure 3:
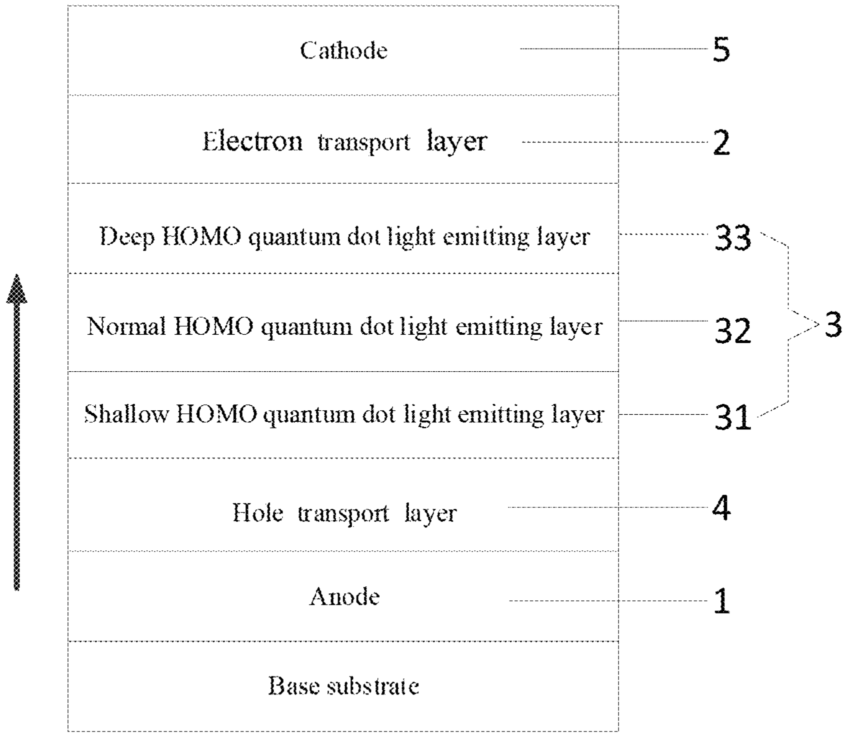
Figure 4:
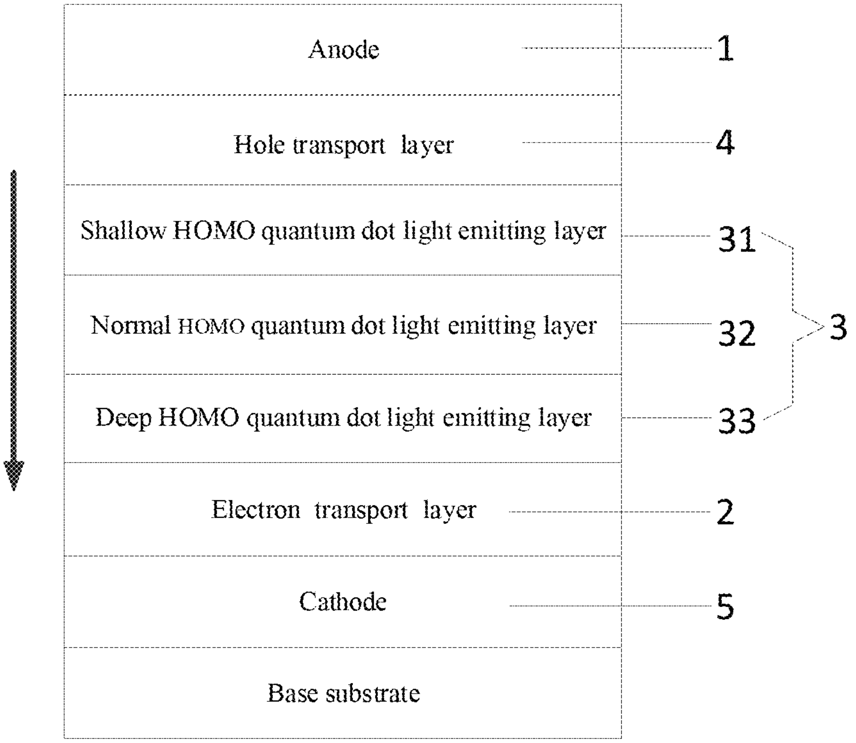
Figure 5:
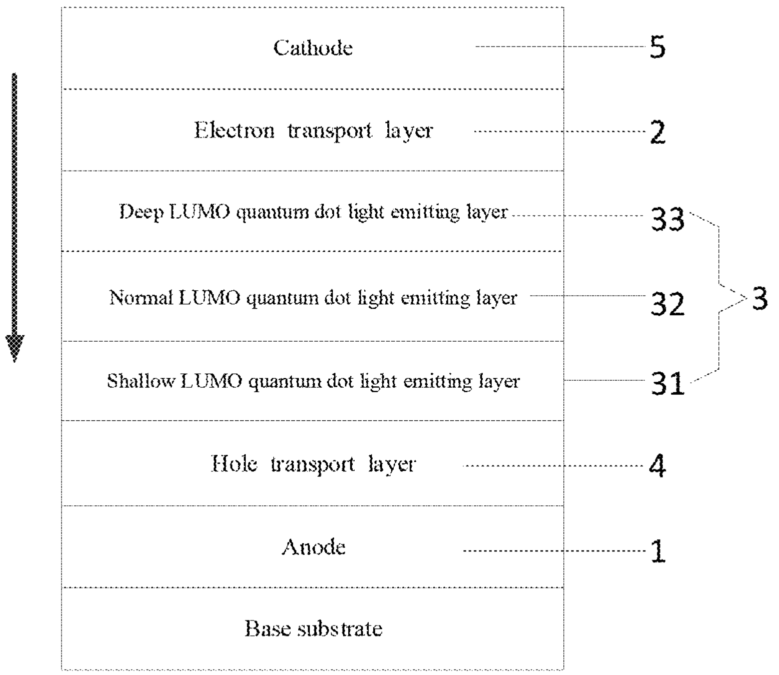
Figure 6:
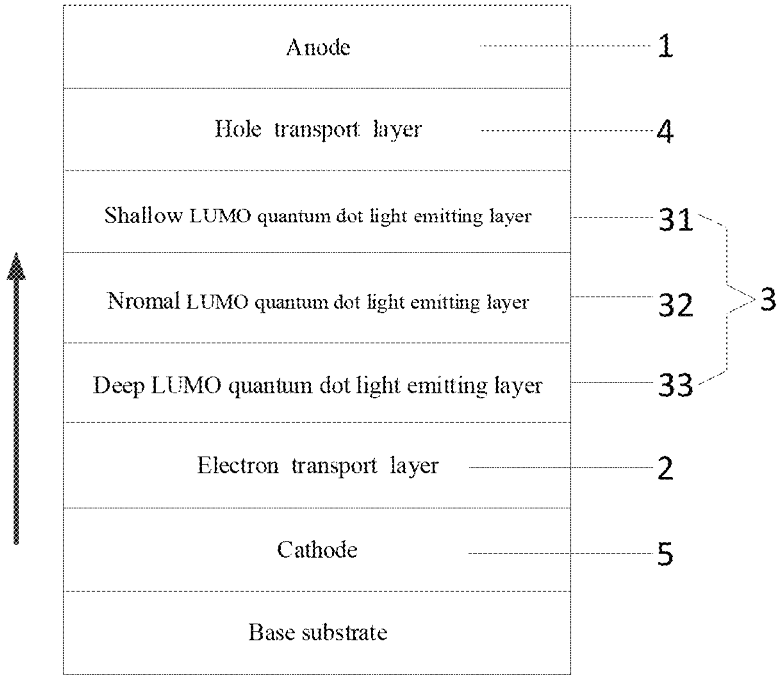

A quantum dot light emitting device provided by an embodiment of the present application, as shown in FIG. 1 to FIG. 6, includes an anode 1, one or more layers of light emitting functional layers (exemplified by including three light emitting function layers: an electron transport layer 2, a quantum dot light emitting layer 3 and a hole transport layer 4) and a cathode 5 which are disposed in layer configuration. At least one of the one or more layers of light emitting functional layers includes at least two sub-function layers, for example, as shown in FIG. 1 and FIG. 2, the electron transport layer 2 includes at least two sub-function layers; as shown in FIG. 3 and FIG. 4, the quantum dot light emitting layer 3 includes at least two sub-function layers, and as shown in FIG. 5 and FIG. 6, the hole transport layer 4 includes at least two sub-function layers, and the sub-functional layers of each light emitting function layer are described in detail hereafter. The sub-function layers comprise ligands, and surface energies of the ligands corresponding to the sub-function layers change in gradient along a transmission direction (arrow directions in FIG. 1 to FIG. 6) of carriers in the sub-function layer, so that energy levels of the sub-function layers change in gradient.

According to the quantum dot light emitting device provided by the embodiment of the present application, at least one of the one or more layers of light emitting functional layers is disposed to include at least two sub-function layers, the sub-function layers include the ligands, and the surface energies of the ligands corresponding to the sub-function layers changes in gradient along the transmission direction of the carriers in the sub-function layer, so that the energy levels of the sub-function layers change in gradient; and in this way, the energy levels of the sub-function layers can be matched with the energy levels of the adjacent light emitting function layers so that carrier transmission and balance as well as device efficiency can be improved.

During specific implementation, in the above quantum dot light emitting device provided by the embodiment of the present application, since organic electroluminescent devices have two kinds of bottom emitting and top emitting, a bottom emitting device structure is formed by disposing a transparent anode and reflective cathode structure, and on the contrary, a top light emitting device structure is formed through a transparent cathode and reflective anode structure. Accordingly, different transparent materials are selected according to different device structures, usually transparent or semitransparent materials with high work functions, such as ITO, Ag, NiO, Al and graphene.

Figure 7:
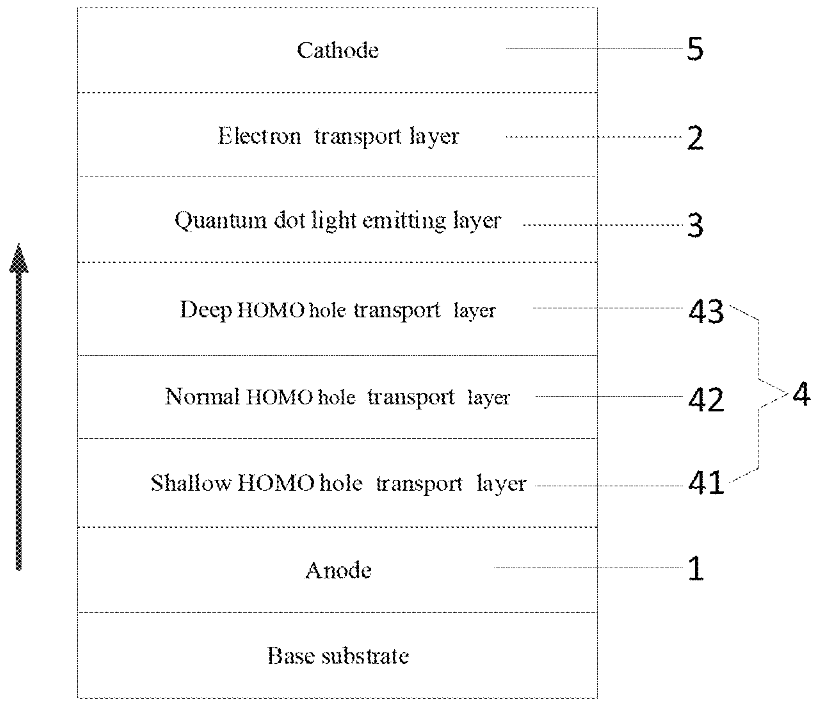
Figure 8:
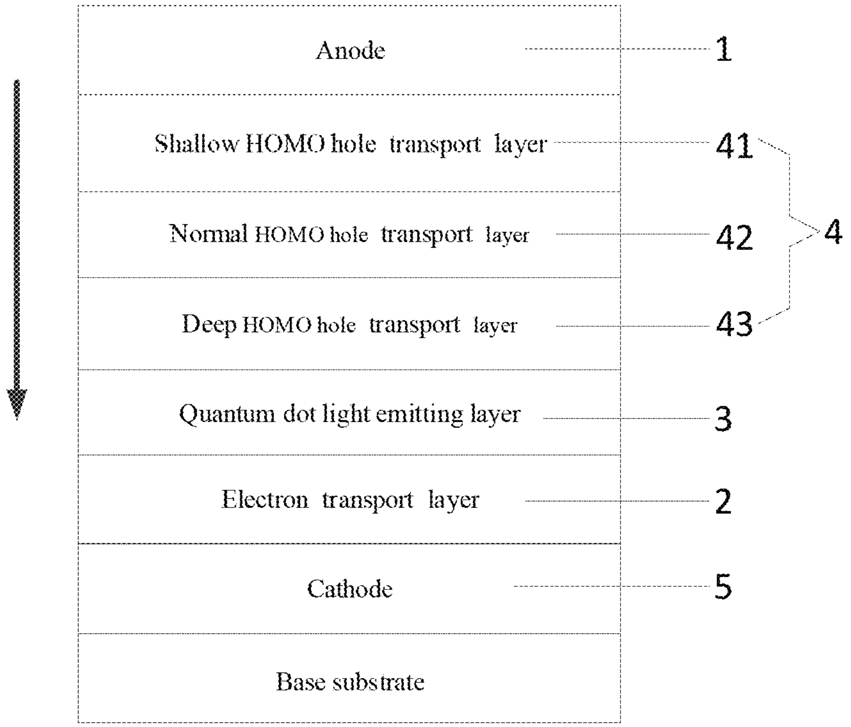

During specific implementation, in the above quantum dot light emitting device provided by the embodiment of the present application, as shown in FIG. 1 to FIG. 8, at least one of the one or more layers of light emitting functional layers includes three sub-function layers. For example, as shown in FIG. 1 and FIG. 2, the electron transport layer 2 includes three sub-function layers. As shown in FIG. 3 to FIG. 6, the quantum dot light emitting layer 3 includes three sub-function layers. As shown in FIG. 7 and FIG. 8, the hole transport layer 4 includes three sub-function layers.

During specific implementation, in the above quantum dot light emitting device provided by the embodiment of the present application, the ligands include: fluorine-containing group ligands with low surface energies, and hydrophobic amine ligands and hydrophilic amine ligands with high surface energies. Specifically, the fluorine-containing group ligands have low surface energies generally, and sub-function layers with low surface energies tend to gather on an upper surface of a film layer. For example, if it is desired that the sub-function layer with the highest energy level in the three sub-function layers is located on the topmost, the sub-function layer with the highest energy level is modified with the fluorine-containing group ligands. If it is desired that the sub-function layer with the lowest energy level in the three sub-function layers is located on the topmost, the sub-function layer with the lowest energy level is modified with the fluorine-containing group ligands.

The surface energies of the hydrophobic amine ligands and the hydrophilic amine ligands are higher than the surface energies of the fluorine-containing group ligands, but the magnitude of the surface energies of the hydrophobic amine ligands and the hydrophilic amine ligands are related to hydrophilic and hydrophobic properties of a front film layer. Specifically, when the light emitting function layer is manufactured on a hydrophilic film layer (front film layer), the surface energies of the hydrophilic amine ligands are greater than that of the hydrophobic amine ligands. The sub-function layers with high surface energies tend to gather on a lower surface of a film layer. For example, if it is desired that the sub-function layer with the highest energy level in the three sub-function layers is located on the lowermost, the sub-function layer with the highest energy level is modified with the hydrophilic amine ligands. If it is desired that the sub-function layer with the normal energy level in the three sub-function layers is located in the middle, the sub-function layer with the normal energy level is modified with the hydrophobic amine ligands.

When the light emitting function layer is manufactured on a hydrophobic film layer (front film layer), the surface energies of the hydrophobic amine ligands are greater than that of the hydrophilic amine ligands. For example, if it is desired that the sub-function layer with the highest energy level in the three sub-function layers is located on the lowermost, the sub-function layer with the highest energy level is modified with the hydrophobic amine ligands. If it is desired that the sub-function layer with the normal energy level in the three sub-function layers is located in the middle, the sub-function layer with the normal energy level is modified with the hydrophilic amine ligands.

Accordingly, when the light emitting function layer is manufactured on the hydrophilic film layer (front film layer), the surface energies of the hydrophilic amine ligands>the surface energies of the hydrophobic amine ligands>the surface energies of the fluorine-containing group ligands. When the light emitting function layer is manufactured on the hydrophobic film layer (front film layer), the surface energies of the hydrophobic amine ligands>the surface energies of the hydrophilic amine ligands>the surface energies of the fluorine-containing group ligands. Accordingly, in the carrier transmission direction, the ligands may be selected for modification according to the magnitude of the energy levels of the sub-function layers, so that the energy levels of the sub-function layers change in gradient in the transmission direction of the carriers in the sub-function layers.

During specific implementation, in the above quantum dot light emitting device provided by the embodiment of the present application, the hydrophilic amine ligands generally include alcohol amine ligands, such as ethanol amine; and the hydrophobic amine ligands generally include alkane amine ligands, such as n-propylamine and n-hexylamine. Specifically, taking the ethanol amine and the n-hexylamine as an example, when the light emitting function layer is manufactured on the hydrophilic film layer (front film layer), the surface energies of ethanol amine ligands>the surface energies of n-hexylamine ligands>the surface energies of the fluorine-containing group ligands. When the light emitting function layer is manufactured on the hydrophobic film layer (front film layer), the surface energies of the n-hexylamine ligands>the surface energies of the alcohol amine ligands>the surface energies of the fluorine-containing group ligands.

During specific implementation, in the above quantum dot light emitting device provided by the embodiment of the present application, as shown in FIG. 1 to FIG. 8, the light emitting function layer includes the electron transport layer 2, the quantum dot light emitting layer 3 and the hole transport layer 4. The electron transport layer 2 is close to the cathode 5, and the hole transport layer 4 is close to the anode 1. At least one of the electron transport layers 2, the quantum dot light emitting layer 3 and the hole transport layer 4 includes three sub-function layers. Specifically, as shown in FIG. 1 and FIG. 2, the electron transport layer 2 includes three sub-function layers. As shown in FIG. 3 to FIG. 6, the quantum dot light emitting layer 3 includes three sub-function layers. As shown in FIG. 7 and FIG. 8, the hole transport layer 4 includes three sub-function layers.

During specific implementation, in the above quantum dot light emitting device provided by the embodiment of the present application, a material of the quantum dot light emitting layer may be a binary, ternary or multiple quantum dot light emitting material, which is not listed one by one here.

Specifically, an electroluminescent device includes an upright type device and an inverted type device, an inverted type structure and an upright type structure are different in that sequences of manufacturing film layers on a base substrate are opposite, a manufacturing sequence of the upright type is that an anode, a hole injection layer, a hole transport layer, a quantum dot light emitting layer, an electron transport layer and a cathode are sequentially manufactured on the base substrate, and a manufacturing sequence of the inverted type is that a cathode, an electron transport layer, a quantum dot light emitting layer, a hole transport layer, a hole injection layer and an anode are sequentially manufactured on the base substrate.

Optionally, the cathode, the anode, the hole injection layer and the electron transport layer are hydrophilic, and the hole transport layer and the quantum dot light emitting layer are hydrophobic.

Specifically, hydrophilicity means a property of water affinity. Hydrophobicity means a property of water repulsion.

Specifically, a semiconductor material generally has a HOMO energy level or a LUMO energy level. The HOMO energy level means a distance between a lowest edge of a semiconductor material energy band and a vacuum energy level. The LUMO energy level means a distance between an uppermost edge of the semiconductor material energy band and the vacuum energy level. No matter the HOMO energy level or the LUMO energy level, the larger the distance from the vacuum energy level, the larger an absolute value of a distance value, which may be expressed as the deeper the energy level; and on the contrary, the shallower the energy level.

During specific implementation, in the above quantum dot light emitting device provided by the embodiment of the present application, as shown in FIG. 1 and FIG. 2, FIG. 1 is the upright type structure, and FIG. 2 is the inverted type structure. The electron transport layer 2 includes a first sub-function layer 21, a second sub-function layer 22 and a third sub-function layer 23 which are disposed in layer configuration, the first sub-function layer 21 is close to the quantum dot light emitting layer 3, and the third sub-function layer 23 is close to the cathode 5. The LUMO energy levels of the first sub-function layer 21, the second sub-function layer 22 and the third sub-function layer 23 deepen in sequence. As shown in FIG. 1, the surface energies of the first sub-function layer 21, the surface energies of the second sub-function layer 22 and the surface energies of the third sub-function layer 23 decrease in sequence. As shown in FIG. 2, the surface energies of the first sub-function layer 21, the surface energies of the second sub-function layer 22 and the surface energies of the third sub-function layer 23 increase in sequence. Specifically, electrons of the cathode 5 are transported into the quantum dot light emitting layer 3 through the electron transport layer 2, and a barrier difference between a single electron transport layer 2 and a quantum dot light emitting layer 3 in the prior art is large, that is, the LUMO energy level of the electron transport layer 2 is deeper than the LUMO energy level of the quantum dot light emitting layer 3, resulting in low electron transport efficiency. In the present application, by disposing the electron transport layer 2 to include the first sub-function layer 21, the second sub-function layer 22 and the third sub-function layer 23 with the LUMO energy levels deepen in sequence, a stepped barrier is formed between the quantum dot light emitting layer 3 and the cathode 5, so that an electron injection capability of the electron transport layer increases in sequence, and an electron injection requirement of the quantum dot light emitting device is met. Besides, the first sub-function layer 21, the second sub-function layer 22 and the third sub-function layer 23 of the present application all include ligands, as shown in FIG. 1, along the transmission direction (the arrow direction in FIG. 1) of the carriers in the sub-function layers, the surface energies of the ligands corresponding to the third sub-function layer 23, the second sub-function layer 22 and the first sub-function layer 21 increase in sequence, and due to the difference of the surface energies, the third sub-function layer 23 with the lowest surface energies tend to gather on an upper surface of the electron transport layer 2, the first sub-function layer 21 with the highest surface energies tend to gather on a lower surface of the electron transport layer 2, and the second sub-function layer 22 with the intermediate surface energies gather in the middle of the electron transport layer 2. In this way, three electron transport materials with different energy levels and correspondingly having three surface energies ligands may be mixed and then form a film through spin-coating, so that the third sub-function layer 23 with the lowest surface energies are closest to the cathode 5, the first sub-function layer 21 with the highest surface energies are closest to the quantum dot light emitting layer 3, and the second sub-function layer 22 with the intermediate surface energies are located between the first sub-function layer 21 and the third sub-function layer 23. Therefore, the LUMO energy level of the electron transport layer 2 may be matched with the HOMO energy level of the quantum dot light emitting layer 3, so that carrier transmission and balance as well as device efficiency can be improved. As shown in FIG. 2, along the transmission direction (the arrow direction in FIG. 2) of the carriers in the sub-function layers, the surface energies of the ligands corresponding to the third sub-function layer 23, the second sub-function layer 22 and the first sub-function layer 21 decreases in sequence, and due to the difference of the surface energies, the first sub-function layer 21 with the lowest surface energies tend to gather on the upper surface of the electron transport layer 2, the third sub-function layer 23 with the highest surface energies tend to gather on the lower surface of the electron transport layer 2, and the second sub-function layer 22 with the intermediate surface energies gather in the middle of the electron transport layer 2. In this way, three electron transport materials with different energy levels and correspondingly having three surface energies ligands may be mixed and then form a film through spin-coating, so that the third sub-function layer 23 with the highest surface energies are closest to the cathode 5, the first sub-function layer 21 with the lowest surface energies are closest to the quantum dot light emitting layer 3, and the second sub-function layer 22 with the intermediate surface energies are located between the first sub-function layer 21 and the third sub-function layer 23. Therefore, the LUMO energy level of the electron transport layer 2 may be matched with the LUMO energy level of the quantum dot light emitting layer 3, so that carrier transmission and balance as well as device efficiency can be improved.

During specific implementation, in the above quantum dot light emitting device provided by the embodiment of the present application, in the upright type structure shown in FIG. 1, when the electron transport layer 2 is manufactured on a hydrophobic film layer (the quantum dot light emitting layer 3), that is, the quantum dot light emitting layer 3 is the front film layer, since the first sub-function layer 21 with the shallowest energy level is located at the lowermost, the first sub-function layer 21 needs to be modified with the hydrophobic amine ligands with the highest surface energies, the second sub-function layer 22 needs to be modified with the hydrophilic amine ligands with the intermediate surface energies, and the third sub-function layer 23 needs to be modified with the fluorine-containing group ligands with the lowest surface energies.

During specific implementation, a material of the electron transport layer is generally zinc oxide, the energy level of the electron transport layer may be adjusted by doping metal ions, such as magnesium ions, in the zinc oxide, and since the electron transport layer is at the LUMO energy level, the more the amount of the doped magnesium ions, the shallower the energy level. Therefore, in the above quantum dot light emitting device provided by the embodiment of the present application, as shown in FIG. 1, a material of the first sub-function layer 21 is magnesium zinc oxide nanoparticles with hydrophobic amine as the ligands, and a molar mass of the magnesium is 0% to 50% that of the magnesium zinc oxide; a material of the second sub-function layer 22 is magnesium zinc oxide nanoparticles with hydrophilic amine as the ligands, and a molar mass of the magnesium is 0% to 50% that of the magnesium zinc oxide; and a material of the third sub-function layer 23 is zinc oxide nanoparticles with fluorine-containing groups as the ligands, and a content of the magnesium in the first sub-function layer is greater than a content of the magnesium in the second sub-function layer. Specifically, the molar mass of the magnesium in the second sub-function layer 22 is 5% that of the magnesium zinc oxide, and the molar mass of the magnesium in the first sub-function layer 21 is 15% that of the magnesium zinc oxide. Therefore, the energy levels of the first sub-function layer 21, the second sub-function layer 22 and the third sub-function layer 23 may be determined based on the content of the magnesium ions doped in zinc oxide, and modification ligand types in all the film layers may be determined according to a film layer position relationship between the first sub-function layer 21, the second sub-function layer 22 and the third sub-function layer 23.

During specific implementation, in the above quantum dot light emitting device provided by the embodiment of the present application, in the inverted type structure shown in FIG. 2, when the electron transport layer 2 is manufactured on a hydrophilic film layer (the cathode 5), that is, the cathode 5 is the front film layer, since the first sub-function layer 21 with the shallowest energy level is located at the uppermost, the first sub-function layer 21 needs to be modified with the fluorine-containing group ligands with the lowest surface energies, the second sub-function layer 22 needs to be modified with the hydrophobic amine ligands with the intermediate surface energies, and the third sub-function layer 23 needs to be modified with the hydrophilic amine ligands with the highest surface energies.

During specific implementation, a material of the electron transport layer is generally zinc oxide, the energy level of the electron transport layer may be adjusted by doping metal ions, such as magnesium ions, in the zinc oxide, and since the electron transport layer is at the LUMO energy level, the more the amount of the doped magnesium ions, the shallower the energy level. Therefore, in the above quantum, dot light emitting device provided by the embodiment of the present application, as shown in FIG. 2, the material of the first sub-function layer 21 is magnesium zinc oxide nanoparticles with the fluorine-containing groups as the ligands, and molar mass of magnesium is 0% to 50% that of magnesium zinc oxide; the material of the second sub-function layer 22 is magnesium zinc oxide nanoparticles with hydrophobic amine as the ligands, and the molar mass of the magnesium is 0% to 50% that of the magnesium zinc oxide; and the material of the third sub-function layer 23 is zinc oxide nanoparticles with hydrophilic amine as the ligands, and the content of the magnesium in the first sub-function layer is greater than the content of the magnesium in the second sub-function layer. Specifically, the molar mass of the magnesium in the second sub-function layer 22 is 5% that of the magnesium zinc oxide, and the molar mass of the magnesium in the first sub-function layer 21 is 15% that of the magnesium zinc oxide.

During specific implementation, in the above quantum dot light emitting device provided by the embodiment of the present application, as shown in FIG. 3 and FIG. 4, the quantum dot light emitting layer 3 includes a fourth sub-function layer 31, a fifth sub-function layer 32 and a sixth sub-function layer 33 which are disposed in layer configuration, the fourth sub-function layer 31 is close to the hole transport layer 4, and the sixth sub-function layer 33 is close to the electron transport layer 2. The HOMO energy levels of the fourth sub-function layer 31, the fifth sub-function layer 32 and the sixth sub-function layer 33 deepen in sequence. As shown in FIG. 3, the surface energies of the fourth sub-function layer 31, the surface energies of the fifth sub-function layer 32 and the surface energies of the sixth sub-function layer 33 decrease in sequence. As shown in FIG. 4, the surface energies of the fourth sub-function layer 31, the surface energies of the fifth sub-function layer 32 and the surface energies of the sixth sub-function layer 33 increase in sequence. Specifically, holes of the anode 1 are transported into the quantum dot light emitting layer 3 through the hole transport layer 4, and a barrier difference between a single hole transport layer 4 and a single quantum dot light emitting layer 3 in the prior art is large, that is, the HOMO energy level of the quantum dot light emitting layer 3 is deeper than the HOMO energy level of the hole transport layer 4, resulting in low hole transport efficiency. In the present application, by disposing the quantum dot light emitting layer 4 to include the fourth sub-function layer 31, the fifth sub-function layer 32 and the sixth sub-function layer 33 with the HOMO energy levels deepen in sequence, a stepped barrier is formed between the quantum dot light emitting layer 3 and the anode 1, so that a hole injection capability of the hole transport layer increases in sequence, and a hole injection requirement of the quantum dot light emitting device is met. Besides, the fourth sub-function layer 31, the fifth sub-function layer 32 and the sixth sub-function layer 33 of the present application all include ligands, as shown in FIG. 3, along the transmission direction (the arrow direction in FIG. 3) of the carriers in the sub-function layers, the surface energies of the ligands corresponding to the fourth sub-function layer 31, the fifth sub-function layer 32 and the sixth sub-function layer 33 decreases in sequence, and due to the difference of the surface energies, the sixth sub-function layer 33 with the lowest surface energies tend to gather on an upper surface of the quantum dot light emitting layer 3, the fourth sub-function layer 31 with the highest surface energies tend to gather on a lower surface of the quantum dot light emitting layer 3, and the fifth sub-function layer 32 with the intermediate surface energies gather in the middle of the quantum dot light emitting layer 3. In this way, three quantum dot materials with different energy levels and correspondingly having three surface energies ligands may be mixed and then form a film through spin-coating, so that the sixth sub-function layer 33 with the lowest surface energies are closest to the electron transport layer 2, the fourth sub-function layer 31 with the highest surface energies are closest to the hole transport layer 4, and the fifth sub-function layer 32 with the intermediate surface energies are located between the fourth sub-function layer 31 and the sixth sub-function layer 33. Therefore, the HOMO energy level of the hole transport layer 4 may be matched with the HOMO energy level of the quantum dot light emitting layer 3, so that carrier transmission and balance as well as device efficiency can be improved. As shown in FIG. 4, along the transmission direction (the arrow direction in FIG. 4) of the carriers in the sub-function layers, the surface energies of the ligands corresponding to the fourth sub-function layer 31, the fifth sub-function layer 32 and the sixth sub-function layer 33 increases in sequence, and due to the difference of the surface energies, the fourth sub-function layer 31 with the lowest surface energies tend to gather on the upper surface of the quantum dot light emitting layer 3, the sixth sub-function layer 33 with the highest surface energies tend to gather on the lower surface of the quantum dot light emitting layer 3, and the fifth sub-function layer 32 with the intermediate surface energies gather in the middle of the quantum dot light emitting layer 3. In this way, three quantum dot materials with different energy levels and correspondingly having three surface energies ligands may be mixed and then form a film through spin-coating, so that the fourth sub-function layer 31 with the lowest surface energies are closest to the hole transport layer 4, the sixth sub-function layer 33 with the highest surface energies are closest to the electron transport layer 2, and the fifth sub-function layer 32 with the intermediate surface energies are located between the fourth sub-function layer 31 and the sixth sub-function layer 33. Therefore, the HOMO energy level of the hole transport layer 4 may be matched with the HOMO energy level of the quantum dot light emitting layer 3, so that carrier transmission and balance as well as device efficiency can be improved.

During specific implementation, quantum dots emit light of different colors by regulating a particle size of the quantum dots; however, the quantum dots emitting the light of different colors are the same in structure, that is, the quantum dots are the same in core-shell part and may be different in surface ligand, and thus if quantum dot light emitting layers having different energy levels are to be obtained, the quantum dots may be modified with different ligands. A ligand material of the quantum dots having a shallow HOMO energy level may be a triphenylamine or carbazole ligand material, a ligand material of the quantum dots having an intermediate HOMO energy level may be an alkane ligand, and a ligand material of the quantum dots having a deep HOMO energy level may be a pyridine ligand material. Accordingly, in the above quantum dot light emitting device provided by some embodiments of the present application, as shown in FIG. 3 and FIG. 4, the ligands of the fourth sub-function layer 31 with the shallowest energy level have triphenylamine or carbazole ligands, the ligands of the fifth sub-function layer with the normal energy level have alkane ligands, and the ligands of the sixth sub-function layer with the deepest energy level have pyridine ligands.

During specific implementation, in the above quantum dot light emitting device provided by the embodiment of the present application, in the upright type structure shown in FIG. 3, when the quantum dot light emitting layer 3 is manufactured on a hydrophobic film layer (hole transport layer 4), since the fourth sub-function layer 31 is located at the lowermost, the ligands of the fourth sub-function layer 31 further have hydrophobic amine ligands, since the sixth sub-function layer 33 is located at the uppermost, the ligands of the sixth sub-function layer 33 further have fluorine-containing group ligands, and the ligands of the fifth sub-function layer 32 located in the middle further have hydrophilic amine ligands.

During specific implementation, in the above quantum dot light emitting device provided by the embodiment of the present application, in the inverted type structure shown in FIG. 4, when the quantum dot light emitting layer 3 is manufactured on a hydrophilic film layer (electron transport layer 2), since the fourth sub-function layer 31 is located at the uppermost, the ligands of the fourth sub-function layer 31 further have fluorine-containing group ligands, since the sixth sub-function layer 33 is located at the lowermost, the ligands of the sixth sub-function layer 33 further have hydrophilic amine ligands, and the ligands of the fifth sub-function layer 32 located in the middle further have hydrophobic amine ligands.

During specific implementation, in the above quantum dot light emitting device provided by the embodiment of the present application, as shown in FIG. 5 and FIG. 6, the quantum dot light emitting layer 3 includes the fourth sub-function layer 31, the fifth sub-function layer 32 and the sixth sub-function layer 33 which are disposed in layer configuration, the fourth sub-function layer 31 is close to the hole transport layer 4, and the sixth sub-function layer 33 is close to the electron transport layer 2. The LUMO energy levels of the fourth sub-function layer 31, the fifth sub-function layer 32 and the sixth sub-function layer 33 deepen in sequence. As shown in FIG. 5, the surface energies of the fourth sub-function layer 31, the surface energies of the fifth sub-function layer 32 and the surface energies of the sixth sub-function layer 33 decrease in sequence. As shown in FIG. 6, the surface energies of the fourth sub-function layer 31, the surface energies of the fifth sub-function layer 32 and the surface energies of the sixth sub-function layer 33 increase in sequence. Specifically, as shown in FIG. 5, electrons of the cathode 5 are transported into the quantum dot light emitting layer 3 through the electron transport layer 2, and a barrier difference between a single electron transport layer 2 and a quantum dot light emitting layer 3 in the prior art is large, that is, the LUMO energy level of the electron transport layer 2 is deeper than the LUMO energy level of the quantum dot light emitting layer 3, resulting in low electron transport efficiency. In the present application, by disposing the quantum dot light emitting layer 3 to include the fourth sub-function layer 31, the fifth sub-function layer 32 and the sixth sub-function layer 33 with the LUMO energy levels deepen in sequence, a stepped barrier is formed between the quantum dot light emitting layer 3 and the cathode 5, so that an electron injection capability of the electron transport layer increases in sequence, and an electron injection requirement of the quantum dot light emitting device is met. Besides, the fourth sub-function layer 31, the fifth sub-function layer 32 and the sixth sub-function layer 33 of the present application all include the ligands, as shown in FIG. 5, along the transmission direction (the arrow direction in FIG. 5) of the carriers in the sub-function layers, the surface energies of the ligands corresponding to the fourth sub-function layer 31, the fifth sub-function layer 32 and the sixth sub-function layer 33 decreases in sequence, and due to the difference of the surface energies, the sixth sub-function layer 33 with the lowest surface energies tend to gather on the upper surface of the quantum dot light emitting layer 3, the fourth sub-function layer 31 with the highest surface energies tend to gather on the lower surface of the quantum dot light emitting layer 3, and the fifth sub-function layer 32 with the intermediate surface energies gather in the middle of the quantum dot light emitting layer 3. In this way, three quantum dot materials with different energy levels and correspondingly having three surface energies ligands may be mixed and then form a film through spin-coating, so that the sixth sub-function layer 33 with the lowest surface energies are closest to the electron transport layer 2, the fourth sub-function layer 31 with the highest surface energies are closest to the hole transport layer 4, and the fifth sub-function layer 32 with the intermediate surface energies are located between the fourth sub-function layer 31 and the sixth sub-function layer 33. Therefore, the LUMO energy level of the electron transport layer 2 may be matched with the LUMO energy level of the quantum dot light emitting layer 3, so that carrier transmission and balance as well as device efficiency can be improved. As shown in FIG. 6, along the transmission direction (the arrow direction in FIG. 6) of the carriers in the sub-function layers, the surface energies of the ligands corresponding to the fourth sub-function layer 31, the fifth sub-function layer 32 and the sixth sub-function layer 33 increases in sequence, and due to the difference of the surface energies, the fourth sub-function layer 31 with the lowest surface energies tend to gather on the upper surface of the quantum dot light emitting layer 3, the sixth sub-function layer 33 with the highest surface energies tend to gather on the lower surface of the quantum dot light emitting layer 3, and the fifth sub-function layer 32 with the intermediate surface energies gather in the middle of the quantum dot light emitting layer 3. In this way, three quantum dot materials with different energy levels and correspondingly having three surface energies ligands may be mixed and then form a film through spin-coating, so that the fourth sub-function layer 31 with the lowest surface energies are closest to the hole transport layer 4, the sixth sub-function layer 33 with the highest surface energies are closest to the electron transport layer 2, and the fifth sub-function layer 32 with the intermediate surface energies are located between the fourth sub-function layer 31 and the sixth sub-function layer 33. Therefore, the LUMO energy level of the hole transport layer 4 may be matched with the LUMO energy level of the quantum dot light emitting layer 3, so that carrier transmission and balance as well as device efficiency can be improved.

During specific implementation, in the above quantum dot light emitting device provided by the embodiment of the present application, in the upright type structure shown in FIG. 5, when the quantum dot light emitting layer 3 is manufactured on a hydrophobic film layer (hole transport layer 4), since the fourth sub-function layer 31 is located at the lowermost, the ligands of the fourth sub-function layer 31 further have hydrophobic amine ligands, since the sixth sub-function layer 33 is located at the uppermost, the ligands of the sixth sub-function layer 33 further have fluorine-containing group ligands, and the ligands of the fifth sub-function layer 32 located in the middle further have hydrophilic amine ligands.

During specific implementation, in the above quantum dot light emitting device provided by the embodiment of the present application, in the inverted type structure shown in FIG. 6, when the quantum dot light emitting layer 3 is manufactured on a hydrophilic film layer (electron transport layer 2), since the fourth sub-function layer 31 is located at the uppermost, the ligands of the fourth sub-function layer further have fluorine-containing group ligands, since the sixth sub-function layer 33 is located at the lowermost, the ligands of the sixth sub-function layer 33 further have hydrophilic amine ligands, and the ligands of the fifth sub-function layer 32 located in the middle further have hydrophobic amine ligands.

During specific implementation, in the above quantum dot light emitting device provided by the embodiment of the present application, as shown in FIG. 7 and FIG. 8, FIG. 7 is an upright type structure, and FIG. 8 is an inverted type structure. The hole transport layer 4 includes a seventh sub-function layer 41, an eighth sub-function layer 42 and a ninth sub-function layer 43 which are disposed in layer configuration, the seventh sub-function layer 41 is close to the anode 1, and the ninth sub-function layer 43 is close to the quantum dot light emitting layer 3. The HOMO energy levels of the seventh sub-function layer 41, the eighth sub-function layer 42 and the ninth sub-function layer 43 deepen in sequence. As shown in FIG. 7, the surface energies of the seventh sub-function layer 41, the surface energies of the eighth sub-function layer 42 and the surface energies of the ninth sub-function layer 43 decrease in sequence. As shown in FIG. 8, the surface energies of the seventh sub-function layer 41, the surface energies of the eighth sub-function layer 42 and the surface energies of the ninth sub-function layer 43 increase in sequence. Specifically, holes of the anode 1 are transported into the quantum dot light emitting layer 3 through the hole transport layer 4, and a barrier difference between a single hole transport layer 4 and a quantum dot light emitting layer 3 in the prior art is large, that is, the HOMO energy level of the quantum dot light emitting layer 3 is deeper than the HOMO energy level of the hole transport layer 4, resulting in low hole transport efficiency. In the present application, by disposing the hole transport layer 4 to include the seventh sub-function layer 41, the eighth sub-function layer 42 and the ninth sub-function layer 43 with the HOMO energy levels deepen in sequence, a stepped barrier is formed between the quantum dot light emitting layer 3 and the anode 1, so that a hole injection capability of the hole transport layer increases in sequence, and a hole injection requirement of the quantum dot light emitting device is met. Besides, the seventh sub-function layer 41, the eighth sub-function layer 42 and the ninth sub-function layer 43 of the present application all include ligands, as shown in FIG. 7, along the transmission direction (the arrow direction in FIG. 7) of the carriers in the sub-function layers, the surface energies of the ligands corresponding to the seventh sub-function layer 41, the eighth sub-function layer 42 and the ninth sub-function layer 43 decreases in sequence, and due to the difference of the surface energies, the ninth sub-function layer 43 with the lowest surface energies tend to gather on an upper surface of the hole transport layer 4, the seventh sub-function layer 41 with the highest surface energies tend to gather on a lower surface of the hole transport layer 4, and the eighth sub-function layer 42 with the intermediate surface energies gather in the middle of the hole transport layer 4. In this way, three hole transport materials with different energy levels and correspondingly having three surface energies ligands may be mixed and then form a film through spin-coating, so that the ninth sub-function layer 43 with the lowest surface energies are closest to the quantum dot light emitting layer 3, the seventh sub-function layer 41 with the highest surface energies are closest to the anode 1, and the eighth sub-function layer 42 with the intermediate surface energies are located between the seventh sub-function layer 41 and the ninth sub-function layer 43. Therefore, the HOMO energy level of the hole transport layer 4 may be matched with the HOMO energy level of the quantum dot light emitting layer 3, so that carrier transmission and balance as well as device efficiency can be improved. As shown in FIG. 8, along the transmission direction (the arrow direction in FIG. 8) of the carriers in the sub-function layers, the surface energies of the ligands corresponding to the seventh sub-function layer 41, the eighth sub-function layer 42 and the ninth sub-function layer 43 increases in sequence, and due to the difference of the surface energies, the seventh sub-function layer 41 with the lowest surface energies tend to gather on the upper surface of the hole transport layer 4, the ninth sub-function layer 43 with the highest surface energies tend to gather on the lower surface of the hole transport layer 4, and the eighth sub-function layer 42 with the intermediate surface energies gather in the middle of the hole transport layer 4. In this way, three hole transport materials with different energy levels and correspondingly having three surface energies ligands may be mixed and then form a film through spin-coating, so that the seventh sub-function layer 41 with the lowest surface energies are closest to the anode 1, the ninth sub-function layer 43 with the highest surface energies are closest to the quantum dot light emitting layer 3, and the eighth sub-function layer 42 with the intermediate surface energies are located between the seventh sub-function layer 41 and the ninth sub-function layer 43. Therefore, the HOMO energy level of the hole transport layer 4 may be matched with the HOMO energy level of the quantum dot light emitting layer 3, so that carrier transmission and balance as well as device efficiency can be improved.

During specific implementation, in the above quantum dot light emitting device provided by the embodiment of the present application, in the upright type structure shown in FIG. 7, when the hole transport layer 4 is manufactured on a hydrophilic film layer (the anode 1), since the ninth sub-function layer 43 with the deepest energy level is located at the uppermost, the ninth sub-function layer 43 needs to be modified with the fluorine-containing group ligands with the lowest surface energies, the eighth sub-function layer 42 needs to be modified with the hydrophobic amine ligands with the intermediate surface energies, and the seventh sub-function layer 41 needs to be modified with the hydrophilic amine ligands with the highest surface energies.

During specific implementation, a material of the hole transport layer is generally nickel oxide, the energy level of the hole transport layer may be adjusted by doping metal ions, such as cesium ions, in the nickel oxide, and since the hole transport layer is at the HOMO energy level, the more the amount of the doped cesium ions, the deeper the energy level. Therefore, in the above quantum dot light emitting device provided by the embodiment of the present application, as shown in FIG. 7, a material of the seventh sub-function layer 41 is nickel oxide nanoparticles with hydrophilic amine as the ligands; a material of the eighth sub-function layer 42 is nickel cesium oxide nanoparticles with hydrophobic amine as the ligands, and a molar mass of the cesium is 0% to 50% that of the nickel cesium oxide; and a material of the ninth sub-function layer 43 is nickel cesium oxide nanoparticles with fluorine-containing groups as the ligands, a molar mass of the cesium is 0% to 50% that of the nickel cesium oxide, and a content of the cesium in the ninth sub-function layer 43 is greater than a content of the cesium in the eighth sub-function layer 42. Specifically, the molar mass of the cesium in the eighth sub-function layer 42 is 5% that of the nickel cesium oxide, and the molar mass of the cesium in the ninth sub-function layer 43 is 15% that of the nickel cesium oxide.

During specific implementation, in the above quantum dot light emitting device provided by the embodiment of the present application, in the inverted type structure shown in FIG. 8, when the hole transport layer 4 is manufactured on a hydrophobic film layer (the quantum dot light emitting layer 3), since the ninth sub-function layer 43 with the deepest energy level is located at the lowermost, the ninth sub-function layer 43 needs to be modified with the hydrophobic amine ligands with the highest surface energies, the eighth sub-function layer 42 needs to be modified with the hydrophilic amine ligands with the intermediate surface energies, and the seventh sub-function layer 41 needs to be modified with the fluorine-containing group ligands with the lowest surface energies.

During specific implementation, a material of the hole transport layer is generally nickel oxide, the energy level of the hole transport layer may be adjusted by doping metal ions, such as cesium ions, in the nickel oxide, and since the hole transport layer is at the HOMO energy level, the more the amount of the doped cesium ions, the deeper the energy level. Therefore, in the above quantum dot light emitting device provided by the embodiment of the present application, as shown in FIG. 8, the material of the seventh sub-function layer 41 is nickel oxide nanoparticles with fluorine-containing groups as the ligands; the material of the eighth sub-function layer 42 is nickel cesium oxide nanoparticles with hydrophilic amine as the ligands, and the molar mass of the cesium is 0% to 50% that of the nickel cesium oxide; and the material of the ninth sub-function layer 43 is nickel cesium oxide nanoparticles with hydrophobic amine as the ligands, the molar mass of the cesium is 0% to 50% that of the nickel cesium oxide, and the content of the cesium in the ninth sub-function layer 43 is greater than the content of the cesium in the eighth sub-function layer 42. Specifically, the molar mass of the cesium in the eighth sub-function layer 42 is 5% that of the nickel cesium oxide, and the molar mass of the cesium in the ninth sub-function layer 43 is 15% that of the nickel cesium oxide.

Based on the same inventive concept, an embodiment of the present application further provides a preparation method of a quantum dot light emitting device, including:

forming an anode, one or more layers of light emitting functional layers and a cathode which are disposed in layer configuration; At least one of the one or more layers of light emitting functional layers is formed through a one-time spin-coating process and includes at least two sub-function layers. The sub-function layers comprise ligands, and surface energies of the ligands corresponding to the sub-function layers change in gradient in a transmission direction of carriers in the sub-function layers, so that energy levels of the sub-function layers change in gradient.

In the preparation method of the quantum dot light emitting device provided by the embodiment of the present application, at least two materials with different surface energies and energy levels are mixed and then form the at least two sub-function layers through the one-time spin-coating process, film layers with gradually-changing energy levels are formed by utilizing the difference of the surface energies, and thus defects between interfaces caused by multi-layer spin-coating film forming may be reduced. Besides, the energy levels of the sub-function layers change in gradient, so that the energy levels of the sub-function layers may be matched with the energy levels of the adjacent light emitting function layers, and carrier transmission and balance as well as device efficiency can be improved.

Figure 9:
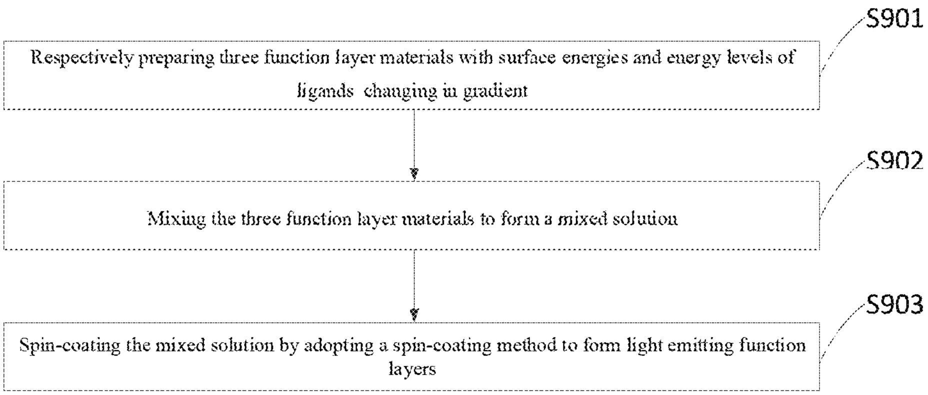
FIG. 9 is a flow chart of a preparation method of a quantum dot light emitting device provided by an embodiment of the present application.

During specific implementation, in the above preparation method provided by the embodiment of the present application, as shown in FIG. 9, the forming the light emitting function layers, may specifically include the following steps.

S901: three function layer materials with surface energies and energy levels of the ligands changing in gradient are prepared.

Specifically, taking the structure shown in FIG. 1 as an example, an electron transport layer 2 is manufactured on a hydrophobic quantum dot light emitting layer 3, and a method for manufacturing a first sub-function layer 21, a second sub-function layer 22 and a third sub-function layer 23 of the electron transport layer 2 is as follows.

Preparation of the third sub-function layer 23 (zinc oxide nanoparticles with fluorine-containing groups as the ligands): with the fluorine-containing groups being pentafluoropropionamide, 3 mmol of zinc acetate is dissolved in 30 mL of dimethyl sulfoxide (DMSO), 5.5 mmol of tetramethylammonium hydroxide (TMAH) is dissolved in 10 mL of ethanol to form a solution, and the solution is slowly dropped into a DMSO solution of the zinc acetate and is stirred for 24 hours at the room temperature. After stirring, the mixed solution is dropped into excess ethyl acetate, and centrifuged to obtain solid particles, the solid particles are dissolved in ethanol again, and 160 μL of pentafluoropropionamide is added therein to serve as ligands so as to stabilize the nanoparticles. The solution is further immersed into excess ethyl acetate, and centrifuged, then solids are dissolved in ethanol to form a zinc oxide solution containing pentafluoropropionamide ligands, that is, a material of the third sub-function layer 23 is formed.

Preparation of the second sub-function layer 22 (magnesium zinc oxide nanoparticles with hydrophilic amine as the ligands, wherein a molar mass of the magnesium is 5% that of the magnesium zinc oxide): with the hydrophilic amine being ethanol amine, 2.85 mmol of zinc acetate and 0.15 mmol of magnesium acetate are dissolved in 30 mL of DMSO, 5.5 mmol of TMAH is dissolved in 10 mL of ethanol to form a solution, and the solution is slowly dropped into a DMSO mixed solution and is stirred for 24 hours at the room temperature. After stirring, the mixed solution is dropped into excess ethyl acetate, and centrifuged to obtain solid particles, the solid particles are dissolved in ethanol again, and 160 μL of ethanol amine is added therein to serve as ligands so as to stabilize the nanoparticles. The solution is further immersed into excess ethyl acetate, and centrifuged, then solids are dissolved in ethanol to form a magnesium zinc oxide (containing 5% of magnesium) solution containing ethanol amine ligands, that is, a material of the second sub-function layer 22 is formed.

Preparation of the first sub-function layer 21 (magnesium zinc oxide nanoparticles with hydrophobic amine as the ligands, wherein a molar mass of the magnesium is 15% that of the magnesium zinc oxide): with the hydrophobic amine being n-hexylamine, 2.55 mmol of zinc acetate and 0.45 mmol of magnesium acetate are dissolved in 30 mL of DMSO, 5.5 mmol of TMAH is dissolved in 10 mL of ethanol to form a solution, and the solution is slowly dropped into a DMSO mixed solution and is stirred for 24 hours at the room temperature. After stirring, the mixed solution is dropped into excess ethyl acetate, and centrifuged to obtain solid particles, the solid particles are dissolved in ethanol again, and 160 μL of n-hexylamine is added therein to serve as ligands so as to stabilize the nanoparticles. The solution is further immersed into excess ethyl acetate, and centrifuged, then solids are dissolved in ethanol to form a magnesium zinc oxide (containing 15% of magnesium)

solution containing n-hexylamine ligands, that is, a material of the first sub-function layer 21 is formed.

It needs to be noted that the above method for forming the first sub-function layer 21, the second sub-function layer 22 and the third sub-function layer 23 only exemplarily illustrates a synthesis process of the function layers, some used parameters are parameters adopted by the inventor of the case at that time, of course, the above parameters are not limited to the numeric values of the case and may be selected according to actual needs, which is not limited to the present application. In addition, when other ligands are synthesized, parameters of different substances are also different, and those skilled in the art may make reasonable proportions.

S902, the three function layer materials are mixed to form a mixed solution.

Specifically, the material of the first sub-function layer 21, the material of the second sub-function layer 22 and the material of the third sub-function layer 23 respectively synthesized in step S901 are mixed to form the mixed solution.

S903, the mixed solution is spin-coated by adopting a spin-coating method to form the light emitting function layers.

Figure 10:
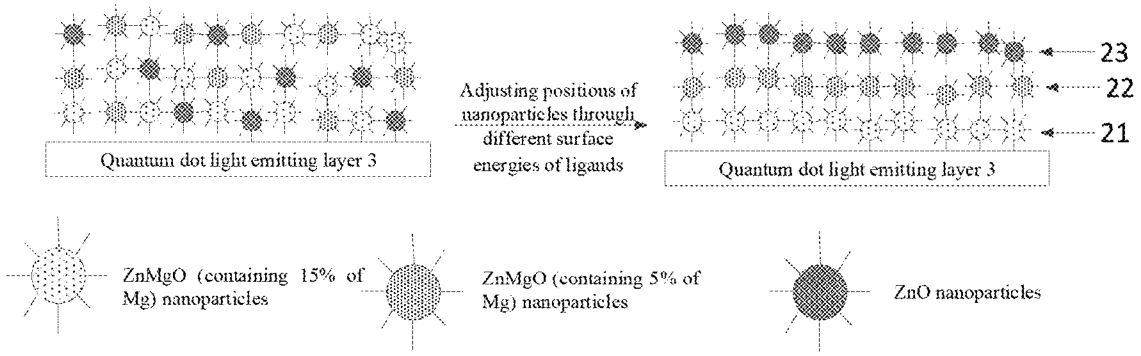
FIG. 10 is a simulation schematic diagram of preparing an electron transport layer in FIG. 1.

Specifically, the quantum dot light emitting layer 3 in the structure shown in FIG. 1 being CdSe/ZnS quantum dots is taken as an example, wherein quantum dot ligands are 1-dodecanethiol. A base substrate where ITO/Ag/ITO is deposited as the anode 1 is spin-coated with a hole transport layer material at about 3,000 rpm, and then annealed at 250° C. for 30 minutes to form a hole transport layer 4. The hole transport layer 4 is spin-coated with quantum dot materials at about 2,500 rpm, and then annealed at 120° C. for 10 minutes to form the quantum dot light emitting layer 3. The magnesium zinc oxide solution (containing 15% of magnesium) containing the n-hexylamine ligands, the magnesium zinc oxide nanoparticles (containing 5% of magnesium) containing the ethanol amine ligands and the zinc oxide solution containing the pentafluoropropionamide ligands in step S902 are dissolved in ethanol together to form the mixed solution with a concentration of 20 mg/mL. The quantum dot light emitting layer 3 is spin-coated with the mixed solution by adopting a spin-coating method at a rotating speed of 2,500 rpm, stood for about 60 seconds, and then annealed at 120° C. for 20 minutes. As shown in FIG. 10, the surface energies of the ligands corresponding to the third sub-function layer 23, the second sub-function layer 22 and the first sub-function layer 21 increases in sequence, and due to the difference of the surface energies, the third sub-function layer 23 with the lowest surface energies tend to gather on an upper surface of the electron transport layer 2, the first sub-function layer 21 with the highest surface energies tend to gather on a lower surface of the electron transport layer 2, and the second sub-function layer 22 with the intermediate surface energies gather in the middle of the electron transport layer 2. In this way, three electron transport materials with different energy levels and correspondingly having three surface energies ligands may be mixed and then form a film through spin-coating, so that the third sub-function layer 23 with the lowest surface energies are closest to the cathode 5, the first sub-function layer 21 with the highest surface energies are closest to the quantum dot light emitting layer 3, and the second sub-function layer 22 with the intermediate surface energies are located between the first sub-function layer 21 and the third sub-function layer 23. Therefore, the LUMO energy level of the electron transport layer 2 may be matched with the LUMO energy level of the quantum dot light emitting layer 3, so that carrier transmission and balance as well as device efficiency can be improved.

It needs to be noted that some used parameters in the structure shown in FIG. 1 are parameters adopted by the inventor of the case at that time, of course, the above parameters are not limited to the numeric values of the case and may be selected according to actual needs, which is not limited to the present application.

In the preparation method of the quantum dot light emitting device provided by the embodiment of the present application, three materials with different surface energies and energy levels are mixed and then form the first sub-function layer 21, the second sub-function layer 22 and the third sub-function layer 23 through one-time spin-coating, the film layers with gradually-changing energy levels are formed by utilizing the difference of the surface energies, and thus defects between interfaces caused by multi-layer spin-coating film forming may be reduced.

During specific implementation, in the above preparation method provided by the embodiment of the present application, after the electron transport layer 2 in FIG. 1 is formed, the method further includes forming the cathode to complete preparation of the whole device. A cathode material may be silver with a thickness of about 120 nm.

Figure 11:
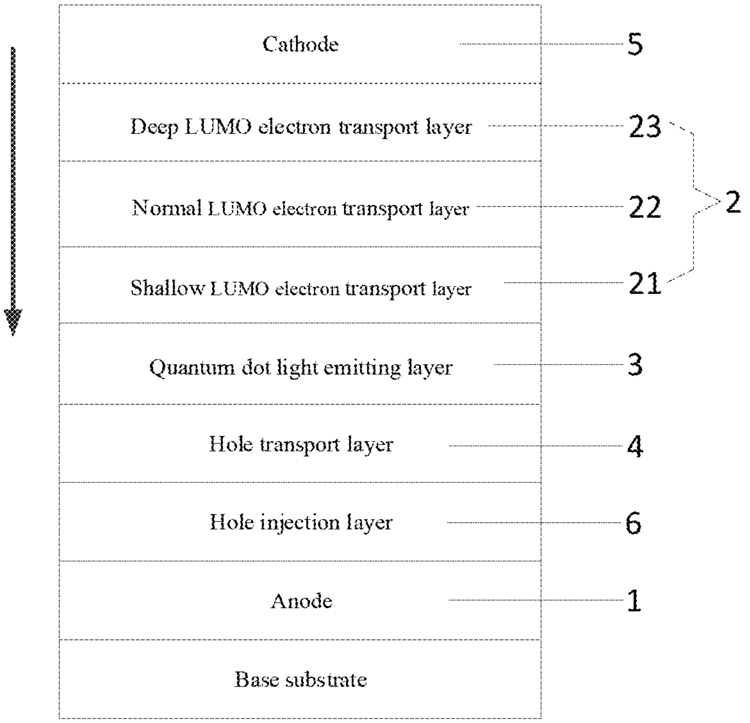
FIG. 11 is a schematic diagram of a structure including a hole injection layer corresponding to that shown in FIG. 1.
Figure 12:
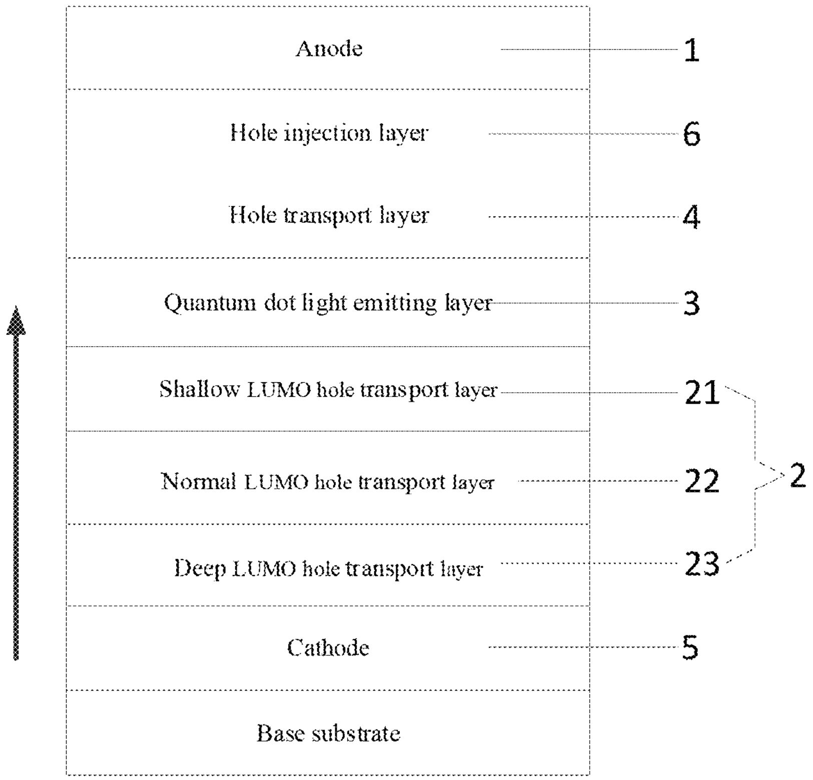
FIG. 12 is a schematic diagram of a structure including a hole injection layer corresponding to that shown in FIG. 2.

During specific implementation, in the above preparation method provided by the embodiment of the present application, after the anode 1 in FIG. 1 is formed and before the hole transport layer 4 is formed, the method may further include forming a hole injection layer 6, as shown in FIG. 11. FIG. 1 shows an upright structure, and when an inverted structure shown in FIG. 2 is adopted, a structure including the hole injection layer 6 is shown in FIG. 12. Structures shown in FIG. 3 to FIG. 8 may also include the hole injection layer.

During specific implementation, in the above preparation method provided by the embodiment of the present application, when the hydrophilic film layer is spin-coated with the mixed solution in step S902, the surface energies of the hydrophilic amine ligands are greater than that of the hydrophobic amine ligands. See description of relevant contents in the quantum dot light emitting device for the specific principle.

When the hydrophobic film layer is spin-coated with the mixed solution in step S902, the surface energies of the hydrophobic amine ligands are greater than that of the hydrophilic amine ligands. See description of relevant contents in the quantum dot light emitting device for the specific principle.

Based on the same inventive concept, an embodiment of the present application further provides a display apparatus, including the quantum dot light emitting device in the above embodiments. Since the principle for solving problems of the display apparatus is similar to the aforementioned quantum dot light emitting device, implementation of the display apparatus may refer to implementation of the aforementioned quantum dot light emitting device, and repetitions are omitted herein.

Figure 13:
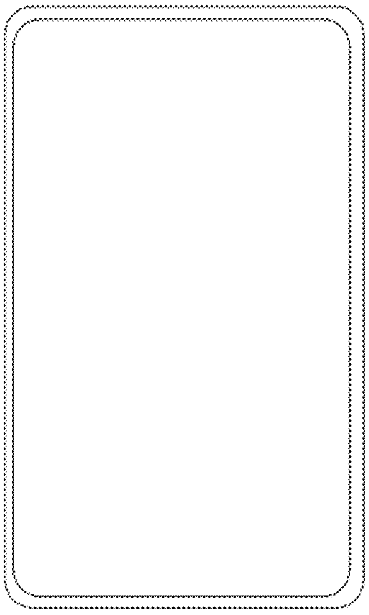
FIG. 13 is a schematic structural diagram of a display apparatus provided by an embodiment of the present application.

During specific implementation, the display apparatus provided by the embodiment of the present application, as shown in FIG. 13, may be: a mobile phone, a tablet computer, a television, a display, a laptop computer, a digital photo frame, a navigator and any product or component having a display function, which is not limited here.

According to the quantum dot light emitting device, the preparation method therefor and the display apparatus provided by the embodiments of the present application, at least one of the one or more layers of light emitting functional layers is disposed to include the at least two sub-function layers, the sub-function layers include the ligands, and the surface energies of the ligands corresponding to the sub-function layers change in gradient along the transmission direction of the carriers in the sub-function layers, so that the energy levels of the sub-function layers change in gradient; and in this way, the energy levels of the sub-function layers can be matched with the energy levels of the adjacent light emitting function layers, so that carrier transmission and balance as well as device efficiency can be improved.

Apparently, those skilled in the art can perform various changes and modifications on the present application without departing from the spirit and scope of the present application. Therefore, if these changes and modifications on the present application fall in the scope of the claims of the present application and their equivalent technologies, the present application is also intended to contain these changes and modifications.

Figure 14:
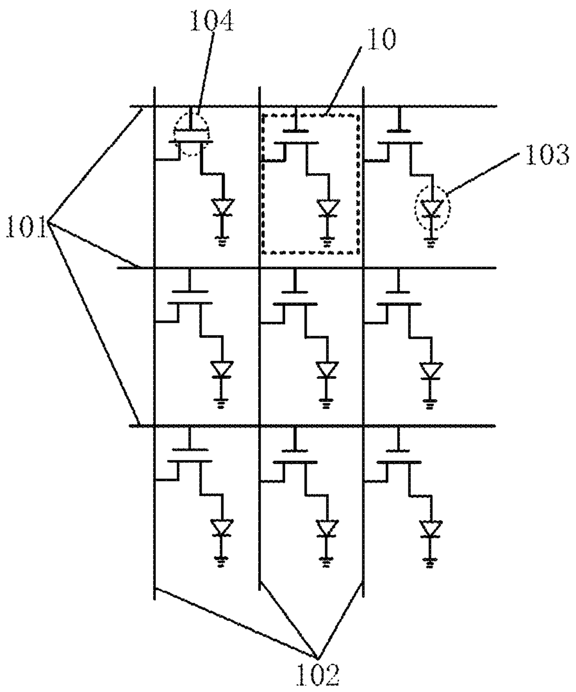
FIG. 14 is a schematic structural diagram of a display substrate provided by an embodiment of the present application.
Figure 15:
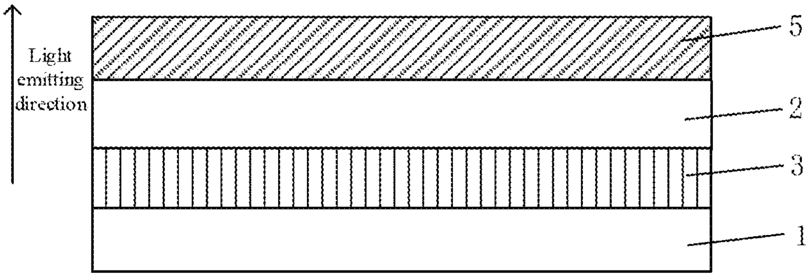
FIG. 15 is a schematic structural diagram of a light emitting device provided by an embodiment of the present application.

Due to the influence of aperture ratio and other factors, a top-emitting type QLED display is mostly used. The top-emitting type QLED display includes a package substrate and a display substrate. Referring to FIG. 14, the display substrate includes a plurality of sub-pixels 10 arranged in an array, and the sub-pixel 10 includes a transistor 104 and a QLED light emitting device 103. Referring to FIG. 15, the QLED light emitting device includes an anode 1, a quantum dot light emitting layer 3, an electron transport layer 2 and a cathode 5 which are sequentially disposed in layer configuration. Referring to FIG. 14, the anode of the QLED light emitting device 103 is electrically connected to the transistor 104. If the cathode is made of a transparent material, light generated by the quantum dot light emitting layer passes through the electron transport layer and the cathode, and finally exits from the package substrate.

However, a light extraction efficiency of the top-emitting type QLED display is relatively low. In order to improve the light extraction efficiency, multiple electron transport layers may be formed by using films with different refractive indexes, so that the light generated by the quantum dot light emitting layer passes through the films with decrease refractive indexes in turn, thus increasing the refraction and final light extraction rate of light. However, when the multiple electron transport layers are formed by using the films with different refractive indexes, multiple processes are needed to prepare a multilayer structure, thus increasing interface defects, which is not conducive to carrier transmission and balance, thus reducing the luminous efficiency and further reducing device performances.

Figure 16:
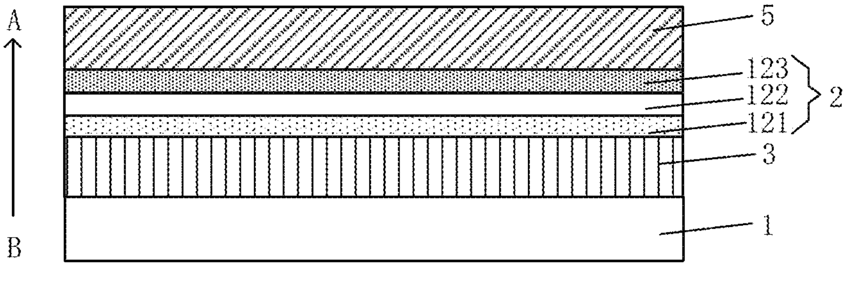
FIG. 16 is a schematic structural diagram of another light emitting device provided by an embodiment of the present application.

Based on the above, an embodiment of the present application provides a light emitting device. As shown in FIG. 16, the light emitting device includes an anode 1, a quantum dot light emitting layer 3, an electron transport layer 2 and a cathode 5 which are disposed in layer configuration.

Referring to FIG. 16, the electron transport layer 2 includes a plurality of electron transport sub-layers, each of which includes inorganic nanoparticles and ligands. The multiple electron transport sub-layers are disposed in layer configuration along a first direction (BA direction shown in FIG. 16), and refractive indexes of the inorganic nanoparticles and surface energies of ligands of layers respectively decrease in turn. The first direction is a direction from the quantum dot light emitting layer to the cathode.

The specific number of electron transport sub-layers is not limited here, and three electron transport sub-layers are illustrated as an example in FIG. 16.

In the above electron transport sub-layers, specific materials of the inorganic nanoparticles are not limited. For example, the inorganic nanoparticles may include inorganic metal oxide nanoparticles or inorganic metal sulfide nanoparticles, and certainly, other types may also be included.

In the electron transport sub-layers above, specific structures of the ligands are not limited. The above-mentioned surface energies refer to an added value of Gibbs free energy when a unit surface area is increased while the temperature, pressure and composition are kept constant.

The multiple electron transport sub-layers may be formed by one-step method, so that the interface defects caused by multi-process preparation can be avoided on the premise of improving the light extraction efficiency, thereby greatly improving the device performances.

Figure 17:
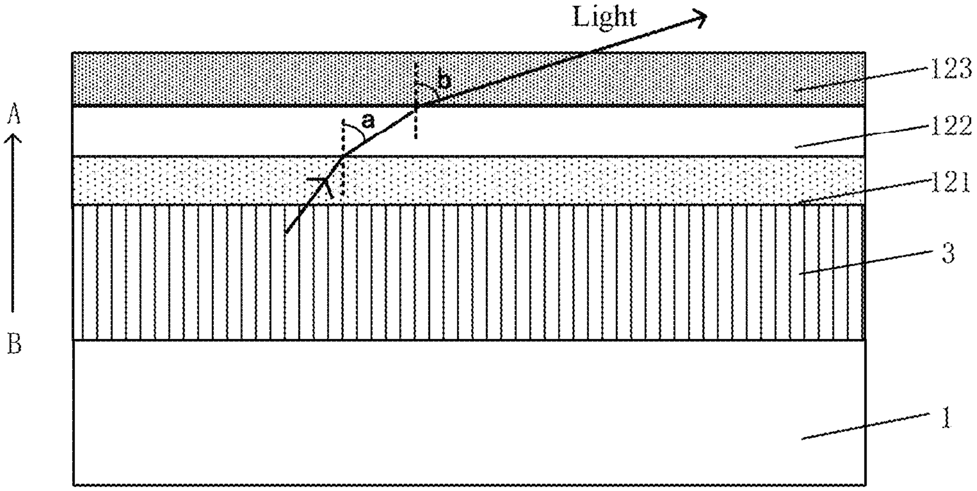
FIG. 17 is an optical path diagram of light refracted through an electron transport layer of FIG. 16.

The principle of improving the light extraction efficiency will be explained below by taking the electron transport layer shown in FIG. 17 as an example. Referring to FIG. 17, the electron transport layer includes a first electron transport sub-layer 121, a second electron transport sub-layer 122 and a third electron transport sub-layer 123 which are disposed in layer configuration along the first direction BA, wherein refractive indexes of the first electron transport sub-layer, the second electron transport sub-layer and the third electron transport sub-layer decrease sequentially. Then, part of the light emitted by the quantum dot light emitting layer is refracted twice at an interface between the first electron transport sub-layer 121 and the second electron transport sub-layer 122, and at an interface between the second electron transport sub-layer 122 and the third electron transport sub-layer 123. Refraction angles of the two refractions are a and b respectively, and the refraction angle a<the refraction angle b, that is, part of the light will be greatly deflected after passing through the electron transport layer, which is beneficial to light emission, thus improving the light extraction efficiency.

Figure 18:
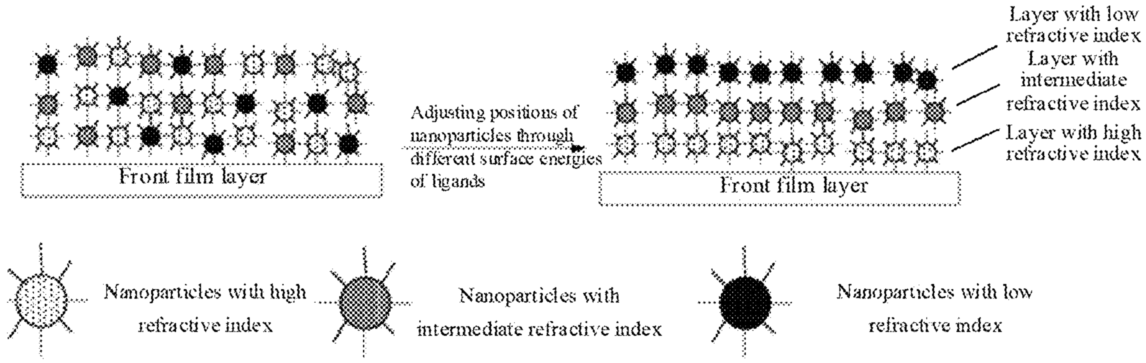
FIG. 18 is a schematic diagram of nanoparticles with different surface energies forming three films layer.

Three electron transport sub-layers are taken as an example to explain the specific formation principle below. Referring to FIG. 18, a mixed solution of nanoparticles with high refractive index, nanoparticles with intermediate refractive index and nanoparticles with low refractive index is formed on a front film layer, wherein the nanoparticles with high refractive index have ligands with high surface energies, the nanoparticles with intermediate refractive index have ligands with intermediate surface energies and the nanoparticles with low refractive index have ligands with low surface energies. In the process of film formation, due to the influences of the surface energies of the ligands, the ligands with low surface energies tend to concentrate on a surface of the solution, while the ligands with high surface energies tend to concentrate in the solution. Finally, three different layers with high, intermediate and low refractive indexes are formed, wherein the layer of the nanoparticles with high refractive index is closest to the front film layer, the layer of the nanoparticles with low refractive index is farthest from the front film layer, and the layer of the nanoparticles with intermediate refractive index is located between the layer of the nanoparticles with high refractive index and the layer of the nanoparticles with low refractive index. The entirety formed by the three films shows a gradient decreasing trend of refractive index from inside to outside.

When the above-mentioned light emitting device is applied to the top-emitting type QLED, a material of the cathode may include a transparent metal oxide, such as Indium Gallium Zinc Oxide (IGZO) or Indium Tin Oxide (ITO); and a material of the anode may include a non-transparent metal, such as silver or aluminum.

A structure of the quantum dot light emitting layer above is not limited. For example, the quantum dot light emitting layer may include quantum dots and quantum dot ligands, and the quantum dot ligands may include hydrophilic ligands, so that the surface of the quantum dot light emitting layer has hydrophilicity; alternatively, hydrophobic ligands may also be included to make the surface of the quantum dot light emitting layer have hydrophobicity. Hydrophilicity means a property of water affinity; and hydrophobicity means a property of water repulsion. The quantum dot may include a core-shell structure or a perovskite nanocrystalline structure. Specifically, the core-shell structure may include an inner core layer and a coating layer surrounding the inner core layer, wherein a material of the inner core layer may be cadmium selenide (CdSe) or cadmium sulfide (CdS), and a material of the coating layer may be any one of zinc sulfide (ZnS), zinc oxide (ZnO) and zinc selenide (ZnSe). The core-shell structure with the cadmium selenide as the inner core layer and the zinc sulfide as the coating layer is mostly used to form the quantum dots. In order to realize color display, the quantum dot layer may include a red quantum dot unit, a green quantum dot unit and a blue quantum dot unit. Certainly, the quantum dot layer may also only include any one of the red quantum dot units, the green quantum dot unit and the blue quantum dot unit, so as to realize single color display.

Figure 19:
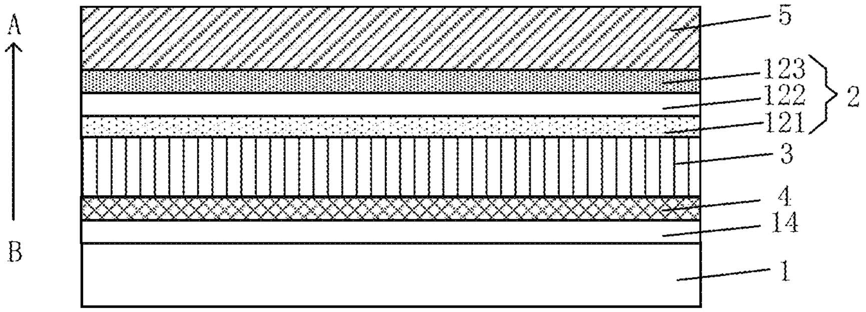
FIG. 19 is a schematic structural diagram of yet another light emitting device provided by an embodiment of the present application.

In order to improve a hole transmission efficiency, as shown in FIG. 19, the light emitting device above may further include a hole injection layer 14 and a hole transport layer 4 located between the anode 1 and the quantum dot light emitting layer 3, wherein the hole injection layer 14 is closer to the anode 1 than the hole transport layer 4.

In the light emitting device provided by the embodiment of the present application, the refractive indexes of the multiple electron transport sub-layers which are disposed in layer configuration along the first direction decrease in turn, so that part of the light emitted by the quantum dot light emitting layer will be refracted at an interface between two adjacent electron transport sub-layers when passing through the electron transport layer, so that part of the light will be greatly deflected after passing through the electron transport layer, which is beneficial to light emission, thus improving the light extraction efficiency. Meanwhile, the surface energies of the ligands of the multiple electron transport sub-layers which are disposed in layer configuration along the first direction decreases in turn, so that the multiple electron transport sub-layers can be formed by one-step method by utilizing the surface energies characteristics of the ligands, so that the interface defects caused by using multiple processes to prepare the multiple electron transport sub-layers can be avoided on the premise of improving the light extraction efficiency, thereby greatly improving the device performances.

Optionally, in order to ensure a light emitting effect and a film forming quality at the same time, as shown in FIG. 16 and FIG. 19, the electron transport layer includes three electron transport sub-layers.

To simplify the structure and facilitate implementation, as shown in FIG. 16, the electron transport layer 2 includes the first electron transport sub-layer 121, the second electron transport sub-layer 122 and the third electron transport sub-layer 123 which are disposed in layer configuration along the first direction BA.

The first electron transport sub-layer includes a first inorganic nanoparticle and a first ligand, the second electron transport sub-layer includes a second inorganic nanoparticle and a second ligand, and the third electron transport sub-layer includes a third inorganic nanoparticle and a third ligand. Refractive indexes of the first inorganic nanoparticle, the second inorganic nanoparticle and the third inorganic nanoparticle decrease in turn, and surface energies of the first ligand, surface energies of the second ligand and surface energies of the third ligand decrease in turn.

Materials of the first inorganic nanoparticle, the second inorganic nanoparticle and the third inorganic nanoparticle above are not limited. For example, the material of the first inorganic nanoparticle may be titanium dioxide with a refractive index of 2.35; the material of the second inorganic nanoparticle may be zinc oxide with a refractive index of 2.0; and the material of the third inorganic nanoparticle may be aluminum oxide with a refractive index of 1.35.

Structures of the first ligand, the second ligand and the third ligand above are not limited. Generally, the surface energies of the ligands containing fluorine groups are small, and magnitude of the surface energies of the ligands containing alkyls and the ligands containing hydroxyls (—OH) or carboxyls (—COOH) need to be determined according to the surface characteristics of the front film layer. Specifically, when the front film layer has hydrophobicity, the surface energies of the ligands containing alkyls are larger than that of the ligands containing hydroxyls or carboxyls. However, when the front film layer has hydrophilicity, the surface energies of the ligands containing hydroxyls or carboxyls are larger than that of the ligands containing alkyls. For example, if the quantum dot light emitting layer has hydrophobicity, the first ligand includes an alkyl, the second ligand includes a hydroxyl or a carboxyl, and the third ligand includes a fluorine-containing group. If the quantum dot light emitting layer has hydrophilicity, the first ligand includes a hydroxyl or carboxyl, the second ligand includes an alkyl, and the third ligand includes a fluorine-containing group.

In one or more embodiments, the quantum dot light emitting layer includes quantum dots and hydrophobic ligands, the first ligand includes an alkyl, the second ligand includes a hydroxyl or a carboxyl, and the third ligand includes a fluorine-containing group.

Here, specific structures of the hydrophobic ligands are not limited, nor are the specific structures of the first ligand, the second ligand and the third ligand, as long as the corresponding groups are met. In this structure, the surface energies of the third ligand containing the fluorine-containing group are smaller than that of the second ligand containing the hydroxyl or carboxyl, and the surface energies of the second ligand containing the hydroxyl or carboxyl are smaller than that of the first ligand containing the alkyl.

Further optionally, in order to reduce the manufacturing difficulty and facilitate realization, the first ligand includes any one of 1,3-dimethylbutylamine (with a chemical formula of $(CH_3)_2CHCH_2CH(CH_3)NH_2$), n-butylamine (with a chemical structural formula of

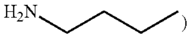
)

and iso-propylamine (with a chemical structural formula of

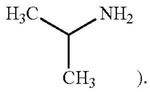
).

The second ligand includes any one of trihydroxymethyl aminomethane (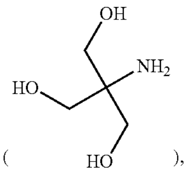), 3-amino-1-propanol (with a chemical structural formula of

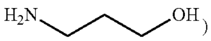)

and isopropanolamine (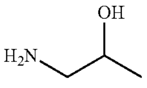).

The third ligand includes any one of pentafluoropropionamide (with a chemical structural formula of

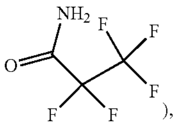), 4-(trifluoromethyl)cyclohexylamine (with a chemical structural formula of

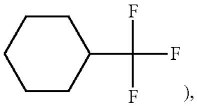), 3-fluoropropylamine (with a chemical structural formula of

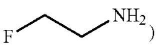)

and 4-(trifluoromethylthio)aniline (with a chemical structural formula of

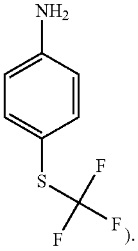 [SMILES: Nc1ccc(SC(F)(F)F)cc1]).

Figure 22:
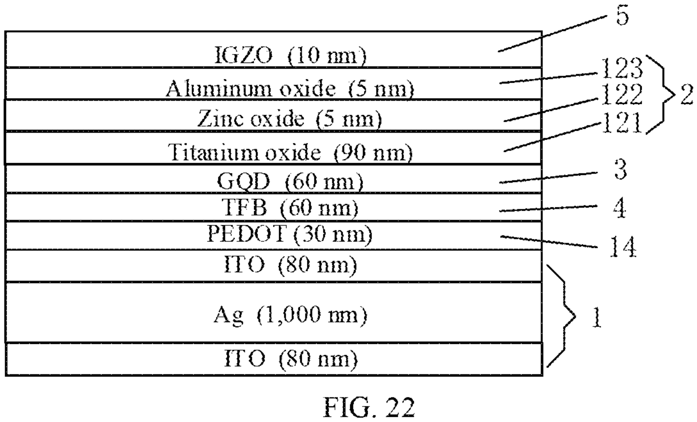
FIG. 22 is a schematic structural diagram of one another light emitting device provided by an embodiment of the present application.

For example, as shown in FIG. 22, the first electron transport sub-layer 121 includes titanium dioxide nanoparticles and 1,3-dimethyln-butylamine ligands, the second electron transport sub-layer 122 includes zinc oxide nanoparticles and trihydroxymethyl aminomethane ligands, and the third electron transport sub-layer 123 includes aluminum oxide nanoparticles and pentafluoropropylamine ligands. A refractive index of the titanium dioxide>a refractive index of the zinc oxide>a refractive index of the aluminum oxide. At the same time, when the quantum dot light emitting layer has hydrophobicity, surface energies of the 1,3-dimethyln-butylamine>surface energies of the trihydroxymethyl aminomethane>surface energies of the pentafluoropropionamide.

Figure 23:
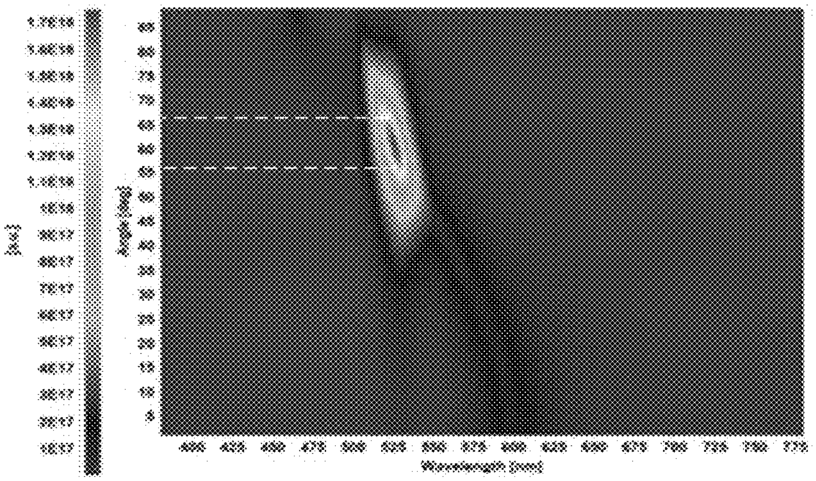
FIG. 23 is a diagram showing a software simulation effect of FIG. 22.

Referring to FIG. 22, the light emitting device includes an anode 1, a hole injection layer 14, a hole transport layer 4, a quantum dot light emitting layer 3, an electron transport layer 2 and a cathode 5, wherein the anode 1 includes a first ITO layer, a silver layer and a second ITO layer, the hole injection layer 14 is made of PEDOT, the hole transport layer 4 is made of TFB, and the cathode 5 is made of IGZO. If the quantum dot light emitting layer 3 is a green quantum dot light emitting layer (GOD) as shown in FIG. 22, and a thickness of each film layer is shown in FIG. 22, software simulation is carried out on a light emitting angle of the light emitting device, which can obtain a simulation result diagram as shown in FIG. 23.

Figure 20:
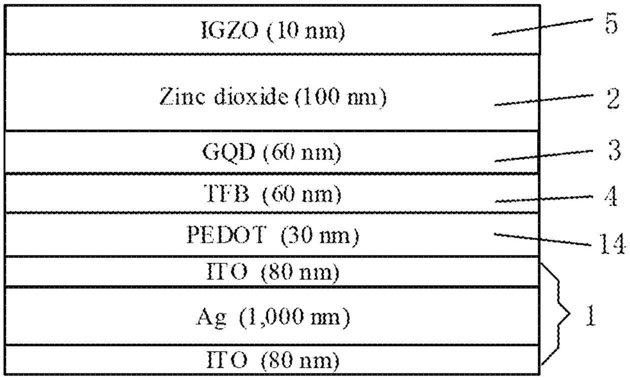
FIG. 20 is a schematic diagram of a comparative structure provided by an embodiment of the present application.
Figure 21:
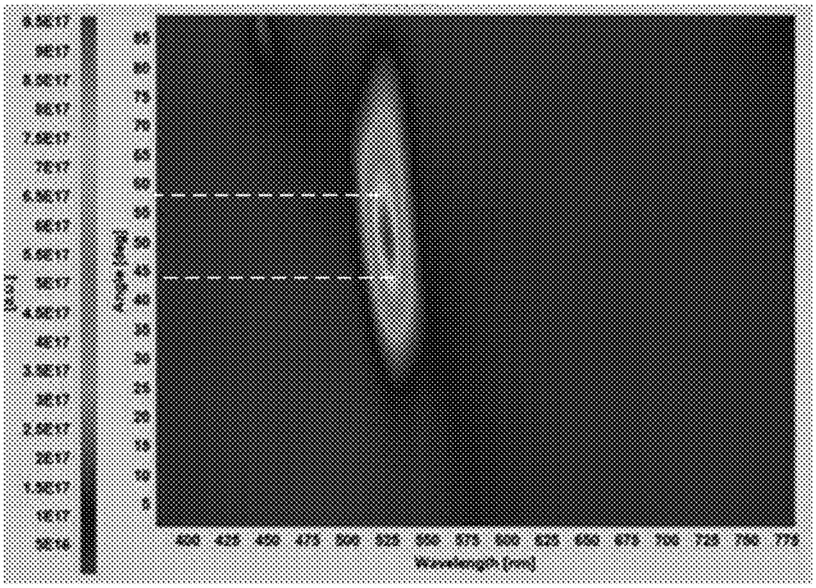
FIG. 21 is a diagram showing a software simulation effect of FIG. 20.

FIG. 20 is a comparative structure, in which the electron transport layer 2 only includes one zinc dioxide layer, and the rest of the structure is the same to that shown in FIG. 22. Software simulation is carried out on a light emitting angle of the light emitting device shown in FIG. 20, and a simulation result diagram as shown in FIG. 21 may be obtained. In FIG. 21, a light emitting angle range of green light is about 44-57°, and a light emitting intensity is 9.5E17. In FIG. 23, a light emitting angle of green light is about 55-66°, and a light emitting intensity is 1.7E18. Compared with FIG. 21 and FIG. 23, it can be concluded that a light emitting of the structure shown in FIG. 22 is more inclined to the front direction, and a light emitting intensity is improved by an order of magnitude, which fully verifies that the light emitting device provided by the present application can improve the luminous efficiency. It should be noted that, in the simulation results of FIG. 21 and FIG. 23, an abscissa Wavelength indicate a wavelength in nanometers (nm), an ordinate Angle indicates an angle in degrees (deg), and a vertical bar on the left indicates a normalized light intensity value. The meaning of the abscissa and the ordinate in the subsequent similar simulation result diagrams is the same as this, and will not be elaborated subsequently.

Figure 26:
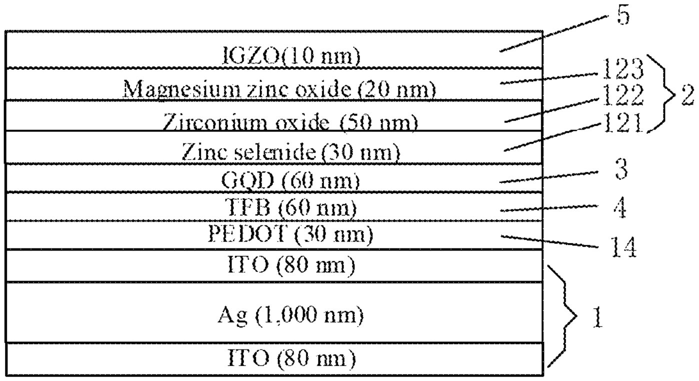
FIG. 26 is a schematic structural diagram of yet another light emitting device provided by an embodiment of the present application.

For example, as shown in FIG. 26, the first electron transport sub-layer 121 includes zinc selenide nanoparticles and n-butylamine ligands, the second electron transport sub-layer 122 includes zirconium oxide nanoparticles and 3-amino-1-propanol ligands, and the third electron transport sub-layer 123 includes magnesium zinc oxide nanoparticles and pentafluoropropylamine ligands. A refractive index of the zinc selenide>a refractive index of the zirconium oxide>a refractive index of the magnesium zinc oxide. At the same time, when the quantum dot light emitting layer has hydrophobicity, surface energies of the n-butylamine>surface energies of the 3-amino-1-propanol>surface energies of the pentafluoropropionamide. The refractive index of the magnesium oxide zinc nanoparticles is 1.85 when a molar fraction of magnesium is 50%.

Figure 27:
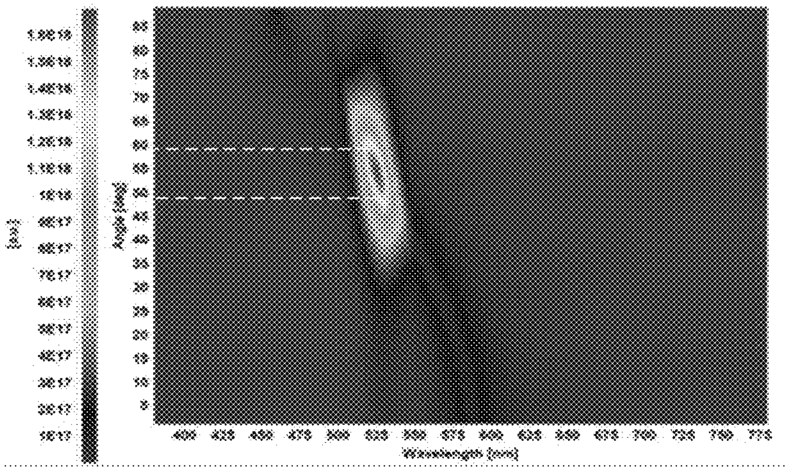
FIG. 27 is a diagram showing a software simulation effect of FIG. 26.

Referring to FIG. 26, the light emitting device includes an anode 1, a hole injection layer 14, a hole transport layer 4, a quantum dot light emitting layer 3, an electron transport layer 2 and a cathode 5, wherein the anode 1 includes a first ITO layer, a silver layer and a second ITO layer, the hole injection layer 14 is made of PEDOT, the hole transport layer 4 is made of TFB, and the cathode 5 is made of IGZO. If the quantum dot light emitting layer 3 is a green quantum dot light emitting layer (GOD) as shown in FIG. 26, and a thickness of each film layer is shown in FIG. 26, software simulation is carried out on a light emitting angle of the light emitting device, which can obtain a simulation result diagram as shown in FIG. 27.

Figure 24:
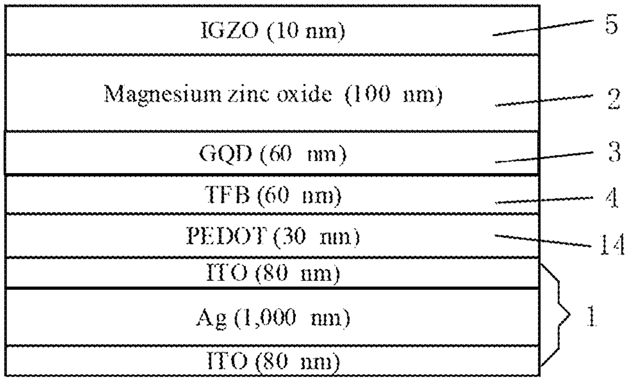
FIG. 24 is a schematic diagram of another comparative structure provided by an embodiment of the present application.
Figure 25:
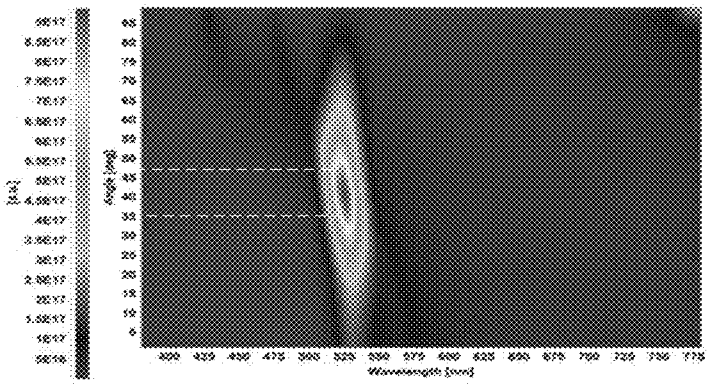
FIG. 25 is a diagram showing a software simulation effect of FIG. 24.

FIG. 24 is a comparative structure, in which the electron transport layer 2 only includes one magnesium zinc oxide layer, and the rest of the structure is the same as that shown in FIG. 26. Software simulation is carried out on a light emitting angle of the light emitting device shown in FIG. 24, and a simulation result diagram as shown in FIG. 25 may be obtained. In FIG. 25, a light emitting angle of green light is about 35-47°, and a light emitting intensity is 9E17. In FIG. 27, a light emitting angle of green light is about 47-57°, and a light emitting intensity is 1.6E18. Compared with FIG. 25 and FIG. 27, it can be concluded that a light emitting of the structure shown in FIG. 26 is more inclined to the front direction, and a light emitting intensity is improved by an order of magnitude, which fully verifies that the light emitting device provided by the present application can improve the luminous efficiency.

Figure 30:
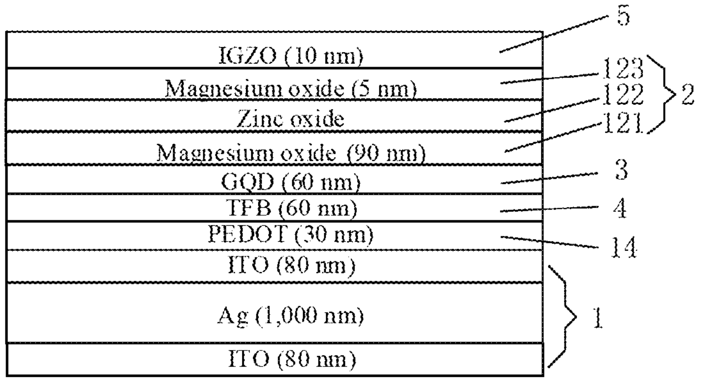
FIG. 30 is a schematic structural diagram of one another light emitting device provided by an embodiment of the present application.

For example, as shown in FIG. 30, the first electron transport sub-layer 121 includes zinc sulfide nanoparticles and iso-propylamine ligands, the second electron transport sub-layer 122 includes zinc oxide nanoparticles and isopropanolamine ligands, and the third electron transport sub-layer 123 includes magnesium oxide nanoparticles and pentafluoropropylamine ligands. A refractive index of the zinc sulfide>a refractive index of zinc oxide>a refractive index of the magnesium oxide. At the same time, when the quantum dot light emitting layer has hydrophobicity, surface energies of the iso-propylamine>surface energies of the isopropanolamine>surface energies of the pentafluoropropionamide.

Figure 31:
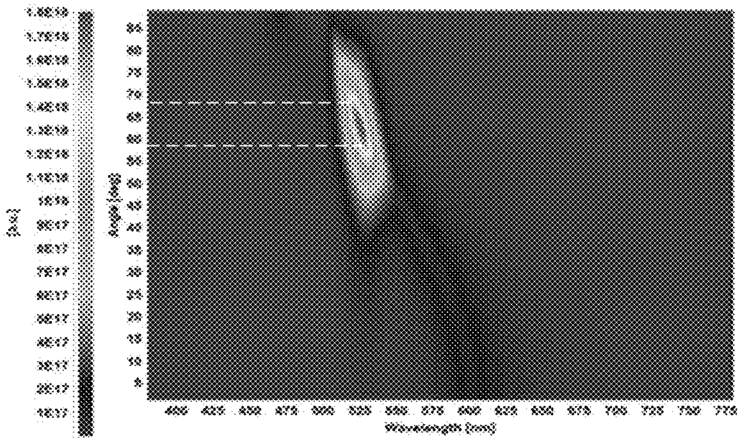
FIG. 31 is a diagram showing a software simulation effect of FIG. 30.

Referring to FIG. 30, the light emitting device includes an anode 1, a hole injection layer 14, a hole transport layer 4, a quantum dot light emitting layer 3, an electron transport layer 2 and a cathode 5, wherein the anode 1 includes a first ITO layer, a silver layer and a second ITO layer, the hole injection layer 14 is made of PEDOT, the hole transport layer 4 is made of TFB, and the cathode 5 is made of IGZO. If the quantum dot light emitting layer 3 is a green quantum dot light emitting layer (GOD) as shown in FIG. 30, and a thickness of each film layer is shown in FIG. 30, software simulation is carried out on a light emitting angle of the light emitting device, which can obtain a simulation result diagram as shown in FIG. 31.

Figure 28:
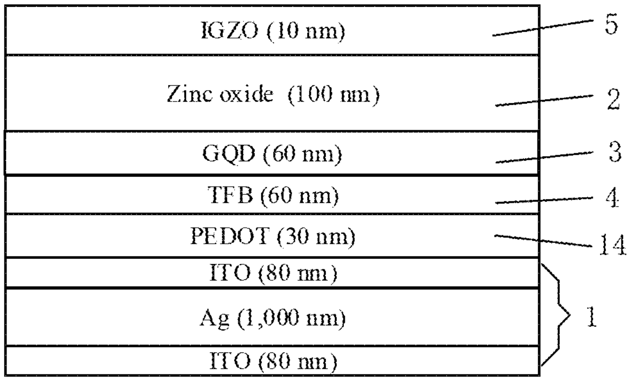
FIG. 28 is a schematic diagram of yet another comparative structure provided by an embodiment of the present application.
Figure 29:
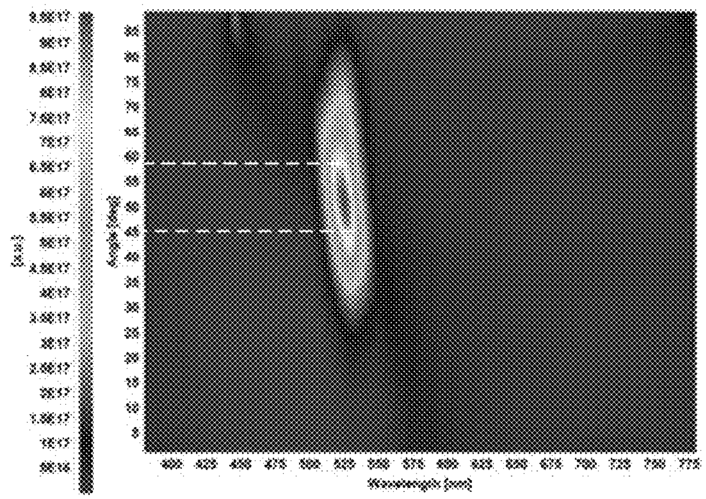
FIG. 29 is a diagram showing a software simulation effect of FIG. 28.

FIG. 28 is a comparative structure, in which the electron transport layer 2 only includes one zinc oxide layer, and the rest of the structure is the same as that shown in FIG. 30. Software simulation is carried out on a light emitting angle of the light emitting device shown in FIG. 28, and a simulation result diagram as shown in FIG. 29 may be obtained. In FIG. 29, a light emitting angle range of green light is about 44-57°, and a light emitting intensity is 9.5E17. In FIG. 31, a light emitting angle of green light is about 57-67°, and a light emitting intensity is 1.8E18. Compared with FIG. 29 and FIG. 31, it can be concluded that a light emitting of the structure shown in FIG. 30 is more inclined to the front direction, and a light emitting intensity is improved by an order of magnitude, which fully verifies that the light emitting device provided by the present application can improve the luminous efficiency.

Optionally, the quantum dot includes a core-shell structure, and the hydrophobic ligand includes 1-dodecanethiol, such that the surface of the quantum dot light emitting layer has good hydrophobicity.

The core-shell structure may include an inner core layer and a coating layer surrounding the inner core layer, wherein a material of the inner core layer may be cadmium selenide (CdSe) or cadmium sulfide (CdS), and a material of the coating layer may be any one of zinc sulfide (ZnS), zinc oxide (ZnO) and zinc selenide (ZnSe). The core-shell structure with the cadmium selenide as the inner core layer and the zinc sulfide as the coating layer (i.e., CdSe/ZnS) is mostly used to form the quantum dots.

In one or more embodiments, the quantum dot light emitting layer includes quantum dots and hydrophilic ligands, the first ligand includes a hydroxyl or a carboxyl, the second ligand includes an alkyl and the third ligand includes a fluorine-containing group.

Here, specific structures of the hydrophilic ligands are not limited, nor are the specific structures of the first ligand, the second ligand and the third ligand, as long as the corresponding groups are met. In this structure, the surface energies of the third ligand containing the fluorine-containing group are smaller than that of the second ligand containing the alkyl, and the surface energies of the second ligand containing the alkyl is smaller than that of the first ligand containing the hydroxyl or carboxyl.

Further optionally, in order to reduce the difficulty of realization, the first ligand includes any one of trihydroxymethyl aminomethane, 3-amino-1-propanol and isopropanolamine; the second ligand includes any one of 1,3-dimethylbutylamine, n-butylamine and iso-propylamine; and the third ligand includes any one of pentafluoropropionamide, 4-(trifluoromethyl)cyclohexylamine, 3-fluoropropylamine and 4-(trifluoromethylthio)niline.

Optionally, in order to reduce the difficulty of realization, the quantum dot includes a core-shell structure, and the hydrophilic ligand includes 1-hydroxyhexanethiol, such that the surface of the quantum dot light emitting layer has good hydrophilicity.

The core-shell structure may include an inner core layer and a coating layer surrounding the inner core layer, wherein a material of the inner core layer may be cadmium selenide (CdSe) or cadmium sulfide (CdS), and a material of the coating layer may be any one of zinc sulfide (ZnS), zinc oxide (ZnO) and zinc selenide (ZnSe). The core-shell structure with the cadmium selenide as the inner core layer and the zinc sulfide as the coating layer is mostly used to form the quantum dots.

In one or more embodiments, a material of the first inorganic nanoparticle includes any one of titanium dioxide, zinc selenide and zinc sulfide; a material of the second inorganic nanoparticle includes zinc oxide or zirconium oxide; and a material of the third inorganic nanoparticle includes any one of aluminum oxide, magnesium zinc oxide and magnesium oxide. For example, the three groups of situations provided in Table 1 may be referred. Certainly, other combinations may also be feasible, which are not listed here one by one. In Table 1, the value of the material after the slash indicates the refractive index of the corresponding material. For example, aluminum oxide/1.35 indicates that the material of the third inorganic nanoparticle is aluminum oxide, and the refractive index of the aluminum oxide is 1.35.

TABLE 1

| | First group | Second group | Third group |
|---|---|---|---|
| First inorganic nanoparticle | Titanium dioxide/2.35 | Zinc selenide/2.58 | Zinc sulfide/2.4 |
| Second inorganic nanoparticle | Zinc oxide/2.0 | Zirconium oxide/2.05 | Zinc oxide/2.0 |
| Third morganic nanoparticle | Aluminum oxide/1.35 | Magnesium zinc oxide/1.85 (containing 50 mol % magnesium) | Magnesium oxide/1.7 |

Table 2 shows some inorganic metal compounds- and refractive indexes thereof. The materials of the first inorganic nanoparticle, the second inorganic nanoparticle and the third inorganic nanoparticle above may also be selected from the inorganic metal compounds provided in Table 2.

TABLE 2

| Inorganic metal compound | Refractive index | Inorganic metal compound | Refractive index |
|---|---|---|---|
| Aluminum oxide | 1.63 | Barium fluoride | 1.40 |
| Titanium dioxide | 2.35 | Zinc sulfide | 2.4 |
| Zirconium oxide | 2.05 | Zinc selenide | 2.58 |
| Magnesium oxide | 1.70 | Zinc oxide | 2.0 |
| Yttrium oxide | 1.80 | Aluminum fluoride | 1.35 |

An embodiment of the present application further provides a display apparatus, including the light emitting device above.

The display apparatus may be a top-emitting type QLED display apparatus, and may further be any product or component with display function such as televisions, digital cameras, mobile phones and tablet computers including the QLED display apparatus; and has the advantages of high light output, no cross-color, high resolution and good display performance.

During specific implementation, an embodiment of the present application further provides a preparation method of the light emitting device above, including the following steps.

S01, an anode and a quantum dot light emitting layer are formed in turn.

The anode above may include a non-transparent metal layer, such as a silver layer or an aluminum layer; alternatively, may further include multiple sub-layers, for example, including a first metal oxide layer, a metal layer and a second metal oxide layer, wherein the metal layer is located between the first metal oxide layer and the second metal oxide layer, the first metal oxide layer and the second metal oxide layer may include an Indium Tin Oxide (ITO) layer, and the metal layer may include a silver layer.

The preparation method of the quantum dot light emitting layer above is not limited, and may be obtained according to related arts and common sense.

S02, an electron transport layer is formed on the quantum dot light emitting layer by a one-step method, wherein the electron transport layer includes multiple electron transport sub-layers and each electron transport sub-layer includes inorganic nanoparticles and ligands. The multiple electron transport sub-layers are disposed in layer configuration along a first direction, and refractive indexes of the inorganic nanoparticles and surface energies of the ligands decrease in turn. The first direction is a direction from a cathode to the quantum dot light emitting layer.

S03, the cathode is formed on the electron transport layer.

A material of the cathode above may include a transparent metal oxide, such as Indium Gallium Zinc Oxide (IGZO) or Indium Tin Oxide (ITO).

By performing steps S01-S03, the light emitting device as shown in FIG. 29 can be obtained. In the preparation method above, the one-step method is adopted to form the electron transport layer, which can avoid an interface defect problem caused by multi-process preparation, thereby improving the device performances. In addition, the light emitting device prepared by the above method has high light extraction efficiency and good device performances.

It should be noted that the structures and materials of the related films involved in the above preparation method may refer to the related descriptions of the aforementioned embodiments of the light emitting devices, and will not be repeated here.

Further optionally, in order to reduce the preparation difficulty and facilitate realization, the S02 of forming the electron transport layer on the quantum dot light emitting layer by one-step method, includes the following steps.

S210, a first electron transport material, a second electron transport material and a third electron transport material are respectively formed. The first electron transport material includes a first inorganic nanoparticle and a first ligand, the second electron transport material includes a second inorganic nanoparticle and a second ligand, and the third electron transport materials includes a third inorganic nanoparticle and a third ligand. Refractive indexes of the first inorganic nanoparticle, the second inorganic nanoparticle and the third inorganic nanoparticle decrease in turn, and surface energies of the first ligand, surface energies of the second ligand and surface energies of the third ligand decrease in turn.

The preparation methods of the first electron transport material, the second electron transport material and the third electron transport material are not limited here, but may be selected according to the actual situations.

S211, the first electron transport material, the second electron transport material and the third electron transport material are mixed to form a mixed solution.

S222, the mixed solution is spin-coated on the quantum dot light emitting layer by adopting a spin-coating method to form the electron transport layer.

As magnitudes of the surface energies of the ligands included in the first electron transport material, the second electron transport material and the third electron transport material are different, the first electron transport material including the first ligand is enriched to an inside of the solution, the second electron transport material including the second ligand is enriched to a middle of the solution, and the third electron transport material including the third ligand is enriched on a surface of the solution, thus forming the first electron transport sub-layer, the second electron transport sub-layer and the third electron transport sub-layer on the quantum dot light emitting layer. The preparation method is simple and easy to realize, and has strong operability.

The preparation method will be described in detail below by taking the light emitting device shown in FIG. 22 as an example.

The method includes the following steps.

S11, a first ITO layer, an Ag (silver) layer and a second ITO layer are deposited on a base in turn to form an anode.

The base above may be a rigid base, such as a glass base; or a flexible base, such as a polyimide (PI) base, which is not limited here. Thicknesses of the first ITO layer, the Ag layer and the second ITO layer in a direction perpendicular to the base may be 80 nm, 1,000 nm and 80 nm respectively.

S12, a hole injection layer is formed on the anode.

Specifically, poly(3,4-ethylenedioxythiophene) (PEDOT) may be spin-coated at a rotating speed of 2,500 rpm to form the hole injection layer, and annealed at 200° C. for 5 minutes. A thickness of the hole injection layer in the direction perpendicular to the base may be 30 nm.

S13, a hole transport layer is formed on the hole injection layer.

Specifically, TFB may be spin-coated at a rotating speed of 3,000 rpm, and annealed at 250° C. for 30 minutes. A thickness of the hole transport layer in the direction perpendicular to the base may be 60 nm.

S14, a quantum dot light emitting layer is formed on the hole transport layer.

Specifically, a quantum dot material may be spin-coated at a rotating speed of 2,500 rpm, and annealed at 120° C. for 10 minutes. The quantum dot light emitting layer includes CdSe/ZnS quantum dots and 1-dodecanethiol hydrophobic ligands. A thickness of the quantum dot light emitting layer in the direction perpendicular to the base may be 60 nm. In FIG. 22, a green quantum dot light emitting layer is illustrated as an example.

S15, a mixed nanoparticle solution of titanium dioxide, zinc oxide and aluminum oxide dropped on the quantum dot light emitting layer, stood for about 30 seconds, spin-coated at a rotating speed of 2,500 rpm, and annealed at 120° C. for 20 minutes to form a titanium dioxide electron transport sub-layer, a zinc oxide electron transport sub-layer and an aluminum oxide electron transport sub-layer.

A ligand of the titanium dioxide nanoparticle is 1,3-dimethylbutylamine, a ligand of the zinc oxide nanoparticle is trihydroxymethyl aminomethane, and a ligand of the aluminum oxide nanoparticle is pentafluoropropionamide. As the quantum dot light emitting layer has hydrophobicity, surface energies of 1,3-dimethylbutylamine>surface energies of trihydroxymethyl aminomethane>surface energies of pentafluoropropionamide. In the film-forming process above, the titanium dioxide nanoparticles are enriched to an inside of the solution, the zinc oxide nanoparticles are enriched to a middle of the solution, and the aluminum oxide nanoparticles are enriched to a surface of the solution to finally form the titanium dioxide electron transport sub-layer, the zinc oxide electron transport sub-layer and the aluminum oxide electron transport sub-layer on the quantum dot light emitting layer.

Thicknesses of the titanium dioxide electron transport sub-layer, the zinc oxide electron transport sub-layer and the aluminum oxide electron transport sub-layer above along the direction perpendicular to the base may be 90 nm, 5 nm and 5 nm respectively.

The preparation method of the titanium dioxide solution will be described in detail below. 3 mmol of titanium acetate is dissolved in 30 mL dimethyl sulfoxide of (DMSO); 5.5 mmol of tetramethylammonium hydroxide (TMAH) is dissolved in 10 mL of ethanol to form a solution, and then the solution is slowly dropped into the DMSO solution of titanium acetate and stirred at room temperature for 24 hours. After stirring, the mixed solution above is dropped into excess ethyl acetate, and centrifuged to obtain solid particles. The solid granules are dissolved in ethanol again, and added 160 μL of 1,3-dimethylbutylamine as ligand to stabilize nanoparticles; then, the solution is deposited in excess ethyl acetate, and the solids are dissolved in ethanol after centrifugation to form the titanium dioxide solution.

The preparation method of the zinc oxide solution will be described in detail below. 3 mmol of zinc acetate is dissolved in 30 mL of DMSO; 5.5 mmol of TMAH is dissolved in 10 mL of ethanol to form a solution, and then the solution is slowly dropped into the DMSO solution of zinc acetate and stirred at room temperature for 24 hours. After stirring, the mixed solution above is dropped into excess ethyl acetate, and centrifuged to obtain solid particles. The solid granules are dissolved in ethanol again, and added 160 μL of trihydroxymethyl aminomethane as ligand to stabilize nanoparticles; then, the solution is deposited in excess ethyl acetate, and the solids are dissolved in ethanol after centrifugation to form the zinc oxide solution.

The preparation method of the aluminum oxide solution will be described in detail below. 3 mmol of aluminum acetate is dissolved in 30 mL of DMSO; 5.5 mmol of TMAH is dissolved in 10 mL of ethanol to form a solution, then the solution is slowly dropped into the DMSO solution of aluminum acetate and stirred at room temperature for 24 hours. After stirring, the mixed solution above is dropped into excess ethyl acetate, and centrifuged to obtain solid particles. The solid granules are dissolved in ethanol again, and added 160 μL of pentafluoropropionamide as ligand to stabilize nanoparticles; then, the solution is deposited in excess ethyl acetate, and the solids are dissolved in ethanol after centrifugation to form the aluminum oxide solution.

S16, a cathode is formed on the aluminum oxide electron transport sub-layer.

Specifically, the cathode may be formed by evaporation of IGZO. A thickness of the cathode in the direction perpendicular to the base may be 10 nm.

By performing steps S11-S16, the light emitting device as shown in FIG. 22 can be formed.

The preparation method will be described in detail below by taking the light emitting device shown in FIG. 26 as an example.

The method includes the following steps.

S21, a first ITO layer, an Ag (silver) layer and a second ITO layer are deposited on a base in turn to form an anode.

The base above may be a rigid base, such as a glass base; or a flexible base, such as a PI (polyimide) base, which is not limited here. Thicknesses of the first ITO layer, the Ag layer and the second ITO layer in a direction perpendicular to the base may be 80 nm, 1,000 nm and 80 un respectively.

S22, a hole injection layer is formed on the anode.

Specifically, poly(3,4-ethylenedioxythiophene) (PEDOT) may be spin-coated at a rotating speed of 2,500 rpm to form the hole injection layer, and annealed at 200° C. for 5 minutes. A thickness of the hole injection layer in the direction perpendicular to the base may be 30 nm.

S23, a hole transport layer is formed on the hole injection layer.

Specifically, TFB may be spin-coated at a rotating speed of 3,000 rpm, and annealed at 250° C. for 30 minutes. A thickness of the hole transport layer in the direction perpendicular to the base may be 60 nm.

S24, a quantum dot light emitting layer is formed on the hole transport layer.

Specifically, a quantum dot material may be spin-coated at a rotating speed of 2,500 rpm, and annealed at 120° C. for 10 minutes. The quantum dot light emitting layer includes CdSe/ZnS quantum dots and 1-dodecanethiol hydrophobic ligands. A thickness of the quantum dot light emitting layer in the direction perpendicular to the base may be 60 nm. In FIG. 26, a green quantum dot light emitting layer is illustrated as an example.

S25, a mixed nanoparticle solution of zinc selenide, zirconium oxide and magnesium zinc oxide is dropped on the quantum dot light emitting layer, stood for about 30 seconds, spin-coated at a rotating speed of 2,500 rpm, and annealed at 120° C. for 20 minutes to form a zinc selenide electron transport sub-layer, a zirconium oxide electron transport sub-layer and a magnesium zinc oxide electron transport sub-layer.

A ligand of the zinc selenide nanoparticle is n-butylamine, a ligand of the zirconium oxide nanoparticle is 3-amino-1-propanol, and a ligand of the magnesium zinc oxide nanoparticle is pentafluoropropionamide. As the quantum dot light emitting layer has hydrophobicity, surface energies of n-butylamine>surface energies of 3-amino-1-propanol>surface energies of pentafluoropropionamide. In the film-forming process, the zinc selenide nanoparticles are enriched to an inside of the solution, the zirconium oxide nanoparticles are enriched to a middle of the solution, and the magnesium zinc oxide nanoparticles are enriched to a surface of the solution to finally form the zinc selenide electron transport sub-layer, the zirconium oxide electron transport sub-layer and the magnesium zinc oxide electron transport sub-layer on the quantum dot light emitting layer.

Thicknesses of the zinc selenide electron transport sub-layer, the zirconium oxide electron transport sub-layer and the magnesium zinc oxide electron transport sub-layer along the direction perpendicular to the base may be 30 nm, 50 nm and 20 nm respectively.

The preparation method of the zinc selenide solution will be described in detail below. The method includes the following steps

S100, a selenium precursor solution is prepared. Specifically, at 220° C., selenium is dissolved in a mixed solution of fatty acid and oleylamine, wherein a volume ratio of the fatty acid to the oleylamine is 1:2, and a mass ratio of the selenium to the mixed solution of fatty acid and oleylamine is 1:1, and then, the mixed solution is cooled to 20° C. to obtain the selenium precursor solution.

S101, a zinc precursor solution is prepared. Specifically, at 250° C., a zinc compound is dissolved in a mixed solution of fatty acid, octadecene and benzophenone in an inert atmosphere, wherein a molar ratio of the four substances is 1:2:5:7, and then the mixed solution is subjected to thermal insulation to prepare the zinc precursor solution.

S102, zinc selenide fluorescent nanoparticles are prepared. Specifically, the selenium precursor solution obtained in step S100 and the zinc precursor solution obtained in step S101 are mixed according to a mass ratio of 1:1, and then reacted at 200° C. for 30 minutes to obtain the zinc selenide fluorescent nanoparticles; and then 160 μL of n-butylamine is added as ligand to stabilize the nanoparticles. Then, the solution is deposited in excess ethyl acetate, and the solids are dissolved in ethanol after centrifugation to form the zinc selenide solution.

The preparation method of the zirconium oxide solution will be described in detail below. 3 mmol of zirconium acetate is dissolved in 30 mL of DMSO; 5.5 mmol of TMAH is dissolved in 10 mL of ethanol to form a solution, and the solution is slowly dropped into the DMSO solution of zirconium acetate and stirred at room temperature for 24 hours. After stirring, the mixed solution above is dropped into excess ethyl acetate, and centrifuged to obtain solid particles. The solid particles are dissolved in ethanol again, and added 160 μL of 3-amino-1-propanol as ligand to stabilize nanoparticles; then, the solution is deposited in excess ethyl acetate, and the solids are dissolved in ethanol after centrifugation to form the zirconium oxide solution.

The preparation method of the magnesium zinc oxide solution will be described in detail below. 1.5 mmol of zinc acetate and 1.5 mmol of magnesium acetate are dissolved in 30 mL of DMSO; 5.5 mmol of TMAH is dissolved in 10 mL of ethanol to form a solution, the solution is slowly dropped into the DMSO solution of magnesium acetate and zinc acetate and stirred at room temperature for 24 hours. After stirring, the mixed solution above is dropped into excess ethyl acetate, and centrifuged to obtain solid particles. The solid granules are dissolved in ethanol again, and added 160 μL of pentafluoropropionamide as ligand to stabilize nanoparticles; then, the solution is deposited in excess ethyl acetate, and the solids are dissolved in ethanol after centrifugation to form the magnesium zinc oxide solution.

S26, a cathode is formed on the magnesium zinc oxide electron transport sub-layer.

Specifically, the cathode may be formed by evaporation of IGZO. A thickness of the cathode in the direction perpendicular to the base may be 10 nm.

By performing steps S21-S26, the light emitting device as shown in FIG. 26 can be formed.

The preparation method will be described in detail below by taking the light emitting device shown in FIG. 30 as an example.

The method includes the following steps.

S31, a first ITO layer, an Ag (silver) layer and a second ITO layer are deposited on a base in turn to form an anode.

The base above may be a rigid base, such as a glass base; or a flexible base, such as a polyimide (PI) base, which is not limited here. Thicknesses of the first ITO layer, the Ag layer and the second ITO layer in a direction perpendicular to the base may be 80 mu, 1,000 nm and 80 nm respectively.

S32, a hole injection layer is formed on the anode.

Specifically, poly(3,4-ethylenedioxythiophene) (PEDOT) may be spin-coated at a rotating speed of 2,500 rpm to form the hole injection layer, and annealed at 200° C. for 5 minutes. A thickness of the hole injection layer in the direction perpendicular to the base may be 30 nm.

S33, a hole transport layer is formed on the hole injection layer.

Specifically, TFB may be spin-coated at a rotating speed of 3,000 rpm, and annealed at 250° C. for 30 minutes. A thickness of the hole transport layer in the direction perpendicular to the base may be 60 nm.

S34, a quantum dot light emitting layer is formed on the hole transport layer.

Specifically, a quantum dot material may be spin-coated at a rotating speed of 2,500 rpm, and annealed at 120° C. for 10 minutes. The quantum dot light emitting layer includes CdSe/ZnS quantum dots and 1-dodecanethiol hydrophobic ligands. A thickness of the quantum dot light emitting layer in the direction perpendicular to the base may be 60 nm. In FIG. 30, a green quantum dot light emitting layer is illustrated as an example.

S35, a mixed nanoparticle solution of zinc sulfide, zinc oxide and magnesium oxide is dropped on the quantum dot light emitting layer, stood for about 30 seconds, spin-coated at a rotating speed of 2,500 rpm, and annealed at 120° C. for 20 minutes to form a zinc sulfide electron transport sub-layer, a zinc oxide electron transport sub-layer and a magnesium oxide electron transport sub-layer.

A ligand of the zinc sulfide nanoparticle is iso-propylamine, a ligand of the zinc oxide nanoparticle is iso-propanolamine, and a ligand of the magnesium oxide nanoparticle is pentafluoropropionamide. As the quantum dot light emitting layer has hydrophobicity, surface energies of iso-propylamine>surface energies of iso-propanolamine>surface energies of pentafluoropropionamide. In the film-forming process, the zinc sulfide nanoparticles are enriched to an inside of the solution, the zinc oxide nanoparticles are enriched to a middle of the solution, and the magnesium oxide nanoparticles are enriched to a surface of the solution to finally form the zinc sulfide electron transport sub-layer, the zinc oxide electron transport sub-layer and the magnesium oxide electron transport sub-layer on the quantum dot light emitting layer.

Thicknesses of the zinc sulfide electron transport sub-layer, the zinc oxide electron transport sub-layer and the magnesium oxide electron transport sub-layer above along the direction perpendicular to the base may be 90 nm, 5 nm and 5 in respectively.

The preparation method of the zinc sulfide solution will be described in detail below. A microemulsion system of CTAB (cetyltrimethylammonium bromide), n-butanol, cyclohexane and water is prepared with 3 mmol of zinc nitrate hexahydrate and 5.5 mmol of sodium sulfide nonahydrate as reaction materials respectively. Two microemulsions are mixed to prepare a zinc sulfide precursor, and then $H_2O$ is used as a hydrothermal reaction medium to perform a hydrothermal reaction at 120° C. for 1 hour to prepare the zinc sulfide nanoparticles. Specifically, the method includes the following steps.

S200, 20 mL of a first microemulsion of CTAB, n-butanol, cyclohexane, water and 3 mmol of $Zn(NO_3)_2 \cdot 6H_2O$ (zinc nitrate hexahydrate) is prepared.

S201, 20 mL of a second microemulsion of CTAB, n-butanol, cyclohexane, water and 5.5 mmol of $Na_2S \cdot 9H_2O$ (sodium sulfide nonahydrate) is prepared.

S202, the first microemulsion and the second microemulsion are mixed to obtain an emulsion containing white precipitates; and the emulsion is stood at room temperature for 12 hours. Then, a demulsifier acetone is added to separate the precipitates; the precipitates are washed with acetone, ethanol and deionized water to obtain ZnS nanoparticles; and then 160 μL of iso-propylamine is added in the ZnS nanoparticles as ligand to stabilize the nanoparticles. Then, the solution is deposited in excess acetone, and the solids are dissolved in ethanol after centrifugation to form the zinc sulfide solution.

The preparation method of the zinc oxide solution will be described in detail below. 3 mmol of zinc acetate is dissolved in 30 mL of DMSO; 5.5 mmol of TMAH is dissolved in 10 mL of ethanol to form a solution, and then the solution is slowly dropped into the DMSO solution of zinc acetate and stirred at room temperature for 24 hours. After stirring, the mixed solution above is dropped into excess ethyl acetate, and centrifuged to obtain solid particles. The solid particles are dissolved in ethanol again, and added 160 μL of isopropanolamine as ligand to stabilize nanoparticles; then, the solution is deposited in excess ethyl acetate, and the solids are dissolved in ethanol after centrifugation to form the zinc oxide solution.

The preparation method of the magnesium oxide solution will be described in detail below. 3 mmol of magnesium acetate is dissolved in 30 mL of DMSO; 5.5 nmol of TMAH is dissolved in 10 mL of ethanol to form a solution, then the solution is slowly dropped into the DMSO solution of magnesium acetate and stirred at room temperature for 24 hours. After stirring, the mixed solution above is dropped into excess ethyl acetate, and centrifuged to obtain solid particles. The solid particles are dissolved in ethanol again, and added 160 μL of pentafluoropropionamide as ligand to stabilize nanoparticles; then, the solution is deposited in excess ethyl acetate, and the solids are dissolved in ethanol after centrifugation to form the magnesium oxide solution.

S36, a cathode is formed on the magnesium oxide electron transport sub-layer.

Specifically, the cathode may be formed by evaporation of IGZO. A thickness of the cathode in the direction perpendicular to the base may be 10 nm.

By performing steps S31-S36, the light emitting device as shown in FIG. 30 can be formed.

The "one embodiment", "an embodiment" or "one or more embodiments" as used herein means that particular features, structures or characteristics described with reference to an embodiment are included in at least one embodiment of the present application. Moreover, it should be noted that here an example using the wording "in an embodiment" does not necessarily refer to the same one embodiment.

Many details are discussed in the specification provided herein. However, it can be understood that the embodiments of the present application may be implemented without those concrete details. In some of the embodiments, well-known processes, structures and techniques are not described in detail, so as not to affect the understanding of the description.

Finally, it should be noted that the above embodiments are only used to illustrate the technical solutions of the present application, but not to limit the technical solutions; although the present application has been described in detail with reference to the foregoing embodiments, those of ordinary skills in the art should understand that: he can still modify the technical solutions set forth by the above embodiments, or make equivalent substitutions to part of the technical features of them. However, these modifications or substitutions shall not depart from the spirit and scope of the technical solutions of the embodiments of the present application.

The invention claimed is:

1. A quantum dot light emitting device, comprising an anode, one or more layers of light emitting functional layers and a cathode which are disposed in layer configuration; wherein, at least one layer of the light emitting functional layers comprises at least two sub-function layers, the sub-function layers comprise ligands, and surface energies of the ligands corresponding to sub-function layers change in gradient along a transmission direction of carriers in the sub-function layers, so that energy levels of the sub-function layers change in gradient;

wherein the light emitting function layer comprises an electron transport layer, a quantum dot light emitting layer and a hole transport layer, the electron transport layer is close to the cathode, and the hole transport layer is close to the anode; wherein, at least one of the electron transport layers, the quantum dot light emitting layer or the hole transport layer comprises three sub-function layers;

wherein when the electron transport layer comprises three sub-function layers, the electron transport layer comprises a first electron transport sub-layer, a second electron transport sub-layer and a third electron transport sub-layer which are disposed in layer configuration along a first direction; the first direction is a direction from the quantum dot light emitting layer to the cathode; and LUMO energy levels of the first electron transport sub-layer, the second electron transport sub-layer and the third electron transport sub-layer deepen in sequence, and the surface energies of the first electron transport sub-layer, the surface energies of the second electron transport sub-layer and the surface energies of the third electron transport sub-layer decrease in sequence.

2. The quantum dot light emitting device according to claim 1, wherein the at least one layer of the light emitting functional layers comprises three sub-function layers;

wherein the ligands comprise: fluorine-containing group ligands with low surface energies as well as hydrophobic amine ligands and hydrophilic amine ligands with high surface energies;

wherein, when the light emitting function layer is manufactured on a hydrophilic film layer, the surface energies of the hydrophilic amine ligands are greater than that of the hydrophobic amine ligands; and when the light emitting function layer is manufactured on a hydrophobic film layer, the surface energies of the hydrophobic amine ligands are greater than that of the hydrophilic amine ligands;

the hydrophilic amine ligands comprise alcohol amine ligands, and the hydrophobic amine ligands comprise alkane amine ligands.

3. The quantum dot light emitting device according to claim 2, wherein when the electron transport layer comprises three sub-function layers, the electron transport layer comprises a first sub-function layer, a second sub-function layer and a third sub-function layer which are disposed in layer configuration, the first sub-function layer is close to the quantum dot light emitting layer, and the third sub-function layer is close to the cathode; and LUMO energy levels of the first sub-function layer, the second sub-function layer and the third sub-function layer deepen in sequence, and the surface energies of the first sub-function layer, the surface energies of the second sub-function layer and the surface energies of the third sub-function layer decrease in sequence or increase in sequence.

4. The quantum dot light emitting device according to claim 3, wherein when the electron transport layer is manufactured on a hydrophobic film layer, a material of the first sub-function layer is magnesium zinc oxide nanoparticles with hydrophobic amine as ligands, and a molar mass of the magnesium is 0% to 50% that of the magnesium zinc oxide; a material of the second sub-function layer is magnesium zinc oxide nanoparticles with hydrophilic amine as ligands, and a molar mass of the magnesium is 0% to 50% that of the magnesium zinc oxide; and a material of the third sub-function layer is zinc oxide nanoparticles with fluorine-containing groups as ligands, and a content of the magnesium in the first sub-function layer is greater than a content of the magnesium in the second sub-function layer; and when the electron transport layer is manufactured on a hydrophilic film layer, a material of the first sub-function layer is magnesium zinc oxide nanoparticles with fluorine-containing groups as ligands, and a molar mass of the magnesium is 0% to 50% that of the magnesium zinc oxide; a material of the second sub-function layer is magnesium zinc oxide nanoparticles with hydrophobic amine as ligands, and a molar mass of the magnesium is 0% to 50% that of the magnesium zinc oxide; and a material of the third sub-function layer is zinc oxide nanoparticles with hydrophilic amine as ligands, and a content of the magnesium in the first sub-function layer is greater than a content of the magnesium in the second sub-function layer.

5. The quantum dot light emitting device according to claim 2, wherein when the electron transport layer comprises three sub-function layers, the electron transport layer comprises a first electron transport sub-layer, a second electron transport sub-layer and a third electron transport sub-layer which are disposed in layer configuration along a first direction; the first direction is a direction from the quantum dot light emitting layer to the cathode; and LUMO energy levels of the first electron transport sub-layer, the second electron transport sub-layer and the third electron transport sub-layer deepen in sequence, and the surface energies of the first electron transport sub-layer, the surface energies of the second electron transport sub-layer and the surface energies of the third electron transport sub-layer decrease in sequence.

6. The quantum dot light emitting device according to claim 5, wherein the first electron transport sub-layer comprises a first inorganic nanoparticle and a first ligand, the second electron transport sub-layer comprises a second inorganic nanoparticle and a second ligand, and the third electron transport sub-layer comprises a third inorganic nanoparticle and a third ligand; wherein, refractive indexes of the first inorganic nanoparticle, the second inorganic nanoparticle and the third inorganic nanoparticle decrease in turn, and surface energies of the first ligand, surface energies of the second ligand and surface energies of the third ligand decrease in turn.

7. The quantum dot light emitting device according to claim 6, wherein the quantum dot light emitting layer comprises quantum dots and hydrophobic ligands, the first ligand comprises an alkyl, the second ligand comprises a hydroxyl or a carboxyl, and the third ligand comprises a fluorine-containing group.

8. The quantum dot light emitting device according to claim 7, wherein the first ligand comprises any one of 1,3-dimethylbutylamine, n-butylamine and iso-propylamine;

the second ligand comprises any one of trihydroxymethyl aminomethane, 3-amino-1-propanol and isopropanolamine; and the third ligand comprises any one of pentafluoropropionamide, 4-(trifluoromethyl)cyclohexylamine, 3-fluoropropylamine and 4-(trifluoromethylthio)aniline;

the quantum dot comprises a core-shell structure, and the hydrophobic ligand comprises 1-dodecanethiol.

9. The quantum dot light emitting device according to claim 6, wherein the quantum dot light emitting layer comprises quantum dots and hydrophilic ligands, the first ligand comprises a hydroxyl or carboxyl, the second ligand comprises an alkyl, and the third ligand comprises a fluorine-containing group;

the first ligand comprises any one of trihydroxymethyl aminomethane, 3-amino-1-propanol and isopropanolamine;

the second ligand comprises any one of 1,3-dimethylbutylamine, n-butylamine and iso-propylamine; and the third ligand comprises any one of pentafluoropropionamide, 4-(trifluoromethyl)cyclohexylamine, 3-fluoropropylamine and 4-(trifluoromethylthio)aniline.

10. The quantum dot light emitting device according to claim 9, wherein the quantum dot comprises a core-shell structure, and the hydrophilic ligand comprises 1-hydroxyhexanethiol.

11. The quantum dot light emitting device according to claim 6, wherein a material of the first inorganic nanoparticle comprises any one of titanium dioxide, zinc selenide and zinc sulfide; a material of the second inorganic nanoparticle comprises zinc oxide or zirconium oxide; and a material of the third inorganic nanoparticle comprises any one of aluminum oxide, magnesium zinc oxide and magnesium oxide.

12. The quantum dot light emitting device according to claim 2, wherein when the quantum dot light emitting layer comprises three sub-function layers, the quantum dot light emitting layer comprises a fourth sub-function layer, a fifth sub-function layer and a sixth sub-function layer which are disposed in layer configuration, the fourth sub-function layer is close to the hole transport layer, and the sixth sub-function layer is close to the electron transport layer; and HOMO energy levels of the fourth sub-function layer, the fifth sub-function layer and the sixth sub-function layer deepen in sequence, and the surface energies of the fourth sub-function layer, the surface energies of the fifth sub-function layer and the surface energies of the sixth sub-function layer decrease in sequence or increase in sequence.

13. The quantum dot light emitting device according to claim 12, wherein ligands of the fourth sub-function layer have triphenylamine or carbazole ligands, ligands of the fifth sub-function layer have alkane ligands, and ligands of the sixth sub-function layer have pyridine ligands;

when the quantum dot light emitting layer is manufactured on a hydrophobic film layer, the ligands of the fourth sub-function layer further have hydrophobic amine ligands, the ligands of the fifth sub-function layer further have hydrophilic amine ligands, and the ligands of the sixth sub-function layer further have fluorine-containing group ligands; and when the quantum dot light emitting layer is manufactured on a hydrophilic film layer, the ligands of the fourth sub-function layer further have fluorine-containing group ligands, the ligands of the fifth sub-function layer further have hydrophobic amine ligands, and the ligands of the sixth sub-function layer further have hydrophilic amine ligands.

14. The quantum dot light emitting device according to claim 2, wherein when the quantum dot light emitting layer comprises three sub-function layers, the quantum dot light emitting layer comprises a fourth sub-function layer, a fifth sub-function layer and a sixth sub-function layer which are disposed in layer configuration, the fourth sub-function layer is close to the hole transport layer, and the sixth sub-function layer is close to the electron transport layer; and LUMO energy levels of the fourth sub-function layer, the fifth sub-function layer and the sixth sub-function layer deepen in sequence, and the surface energies of the fourth sub-function layer, the surface energies of the fifth sub-function layer and the surface energies of the sixth sub-function layer decrease in sequence or increase in sequence.

15. The quantum dot light emitting device according to claim 14, wherein:

when the quantum dot light emitting layer is manufactured on a hydrophobic film layer, the ligands of the fourth sub-function layer have hydrophobic amine ligands, the ligands of the fifth sub-function layer further have hydrophilic amine ligands, and the ligands of the sixth sub-function layer have fluorine-containing group ligands; and when the quantum dot light emitting layer is manufactured on a hydrophilic film layer, the ligands of the fourth sub-function layer further have fluorine-containing group ligands, the ligands of the fifth sub-function layer further have hydrophobic amine ligands, and the ligands of the sixth sub-function layer have hydrophilic amine ligands.

16. The quantum dot light emitting device according to claim 2, wherein when the hole transport layer comprises three sub-function layers, the hole transport layer comprises a seventh sub-function layer, an eighth sub-function layer and a ninth sub-function layer which are disposed in layer configuration, the seventh sub-function layer is close to the anode, and the ninth sub-function layer is close to the quantum dot light emitting layer; and HOMO energy levels of the seventh sub-function layer, the eighth sub-function layer and the ninth sub-function layer deepen in sequence, and the surface energies of the seventh sub-function layer, the surface energies of the eighth sub-function layer and the surface energies of the ninth sub-function layer decrease in sequence or increase in sequence.

17. The quantum dot light emitting device according to claim 16, wherein when the hole transport layer is manufactured on a hydrophilic film layer, a material of the seventh sub-function layer is nickel oxide nanoparticles with hydrophilic amine as ligands; a material of the eighth sub-function layer is nickel cesium oxide nanoparticles with hydrophobic amine as ligands, and a molar mass of the cesium is 0% to 50% that of the nickel cesium oxide; and a material of the ninth sub-function layer is nickel cesium oxide nanoparticles with fluorine-containing groups as ligands, a molar mass of the cesium is 0% to 50% that of the nickel cesium oxide, and a content of the cesium in the ninth sub-function layer is greater than a content of the cesium in the eighth sub-function layer; and when the hole transport layer is manufactured on a hydrophobic film layer, a material of the seventh sub-function layer is nickel oxide nanoparticles with fluorine-containing groups as ligands; a material of the eighth sub-function layer is nickel cesium oxide nanoparticles with hydrophilic amine as ligands, and a molar mass of the cesium is 0% to 50% that of the nickel cesium oxide; and a material of the ninth sub-function layer is nickel cesium oxide nanoparticles with hydrophobic amine as ligands, a molar mass of the cesium is 0% to 50% that of the nickel cesium oxide, and a content of the cesium in the ninth sub-function layer is greater than a content of the cesium in the eighth sub-function layer.

18. A display apparatus, comprising the quantum dot light emitting device according to claim 1.

19. A preparation method of a quantum dot light emitting device, comprising:

forming an anode, one or more layers of light emitting functional layers and a cathode which are disposed in layer configuration; wherein, at least one layer of the light emitting functional layers is formed through a one-time spin-coating process, and comprises at least two sub-function layers; wherein, the sub-function layers comprise ligands, and surface energies of the ligands corresponding to sub-function layers change in gradient along a transmission direction of carriers in the sub-function layers, so that energy levels of the sub-function layers change in gradient;

wherein the light emitting function layer comprises an electron transport layer, a quantum dot light emitting layer and a hole transport layer, the electron transport layer is close to the cathode, and the hole transport layer is close to the anode; wherein, at least one of the electron transport layers, the quantum dot light emitting layer or the hole transport layer comprises three sub-function layers;

wherein when the electron transport layer comprises three sub-function layers, the electron transport layer comprises a first electron transport sub-layer, a second electron transport sub-layer and a third electron transport sub-layer which are disposed in layer configuration along a first direction; the first direction is a direction from the quantum dot light emitting layer to the cathode; and LUMO energy levels of the first electron transport sub-layer, the second electron transport sub-layer and the third electron transport sub-layer deepen in sequence, and the surface energies of the first electron transport sub-layer, the surface energies of the second electron transport sub-layer and the surface energies of the third electron transport sub-layer decrease in sequence.

20. The preparation method according to claim 19, wherein the step of forming the light emitting function layers comprises:

preparing three function layer materials with surface energies and energy levels of the ligands changing in gradient;

mixing the three function layer materials to form a mixed solution; and spin-coating the mixed solution by adopting a spin-coating method to form the light emitting function layers;

when the mixed solution is spin-coated on a hydrophilic film layer, surface energies of hydrophilic amine ligands are greater than that of hydrophobic amine ligands; and when the mixed solution is spin-coated on a hydrophobic film layer, the surface energies of the hydrophobic amine ligands are greater than that of the hydrophilic amine ligands.

* * * * *